(12) United States Patent
Barlow

(10) Patent No.: US 9,202,888 B2
(45) Date of Patent: Dec. 1, 2015

(54) TRENCH HIGH ELECTRON MOBILITY TRANSISTOR DEVICE

(71) Applicant: Stephen P. Barlow, Noblesville, IN (US)

(72) Inventor: Stephen P. Barlow, Noblesville, IN (US)

( * ) Notice: Subject to any disclaimer, the term of this patent is extended or adjusted under 35 U.S.C. 154(b) by 37 days.

(21) Appl. No.: 14/307,215

(22) Filed: Jun. 17, 2014

(65) Prior Publication Data

US 2014/0367695 A1 Dec. 18, 2014

Related U.S. Application Data

(60) Provisional application No. 61/836,338, filed on Jun. 18, 2013, provisional application No. 61/858,850, filed on Jul. 26, 2013, provisional application No. 61/867,288, filed on Aug. 19, 2013, provisional application No. 62/007,637, filed on Jun. 4, 2014.

(51) Int. Cl.

| | |
|---|---|
| *H01L 29/778* | (2006.01) |
| *H01L 29/66* | (2006.01) |
| *H01L 29/20* | (2006.01) |
| *H01L 29/205* | (2006.01) |
| *H01L 29/04* | (2006.01) |
| *H01L 29/06* | (2006.01) |
| *H01L 29/49* | (2006.01) |
| *H01L 29/417* | (2006.01) |
| *H01L 29/45* | (2006.01) |
| *H01L 29/10* | (2006.01) |
| *H01L 21/306* | (2006.01) |
| *H01L 21/8258* | (2006.01) |

(52) U.S. Cl.
CPC .... *H01L 29/66431* (2013.01); *H01L 21/30608* (2013.01); *H01L 29/045* (2013.01); *H01L 29/0688* (2013.01); *H01L 29/1029* (2013.01); *H01L 29/2003* (2013.01); *H01L 29/205* (2013.01); *H01L 29/41741* (2013.01); *H01L 29/452* (2013.01); *H01L 29/456* (2013.01); *H01L 29/4916* (2013.01); *H01L 21/8258* (2013.01)

(58) Field of Classification Search
USPC .......................................................... 257/76
See application file for complete search history.

(56) References Cited

U.S. PATENT DOCUMENTS

| | | | |
|---|---|---|---|
| 7,956,370 B2 | 6/2011 | Pan | |
| 8,217,418 B1 | 7/2012 | Pan et al. | |
| 8,268,648 B2 | 9/2012 | Pan | |
| 8,283,676 B2 | 10/2012 | Pan et al. | |
| 8,304,794 B2 | 11/2012 | Pan | |
| 8,313,963 B2 | 11/2012 | Pan | |
| 8,624,292 B2 | 1/2014 | Pan et al. | |
| 8,674,383 B2 | 3/2014 | Pan | |
| 8,722,441 B2 | 5/2014 | Pan et al. | |
| 2010/0066348 A1* | 3/2010 | Merz .................... | C12Q 1/6869 324/71.1 |

(Continued)

*Primary Examiner* — Thao P Le
(74) *Attorney, Agent, or Firm* — C. John Brannon; Brannon Sowers and Cracraft PC

(57) ABSTRACT

A method for producing a solid state device, including forming a first dielectric layer over an epitaxial layer at least partially covering the a Silicon substrate and depositing a photoresist material thereover, removing a predetermined portion first dielectric layer to define an exposed portion, implanting dopants into the exposed portion to define a doped portion, preferentially removing Silicon from the exposed portion to generate trenches having V-shaped cross-sections and having first and second angled sidewalls defining the V-shaped cross-section, wherein each angled sidewall defining the V-shaped cross-section is a Silicon face having a 111 orientation, and forming a 2DEG on at least one sidewall.

20 Claims, 19 Drawing Sheets

DRAIN ELECTRODE

(56) References Cited

U.S. PATENT DOCUMENTS

| | | | |
|---|---|---|---|
| 2010/0096668 A1* | 4/2010 | Briere | H01L 29/045 257/194 |
| 2011/0108850 A1 | 5/2011 | Cheng et al. | |
| 2012/0098599 A1* | 4/2012 | Chang | H01L 29/7787 330/277 |
| 2012/0181548 A1 | 7/2012 | Okada et al. | |
| 2012/0305987 A1 | 12/2012 | Hirler et al. | |
| 2012/0313106 A1* | 12/2012 | He | H01L 29/1066 257/76 |
| 2014/0264380 A1* | 9/2014 | Kub | H01L 29/41725 257/77 |
| 2015/0162424 A1* | 6/2015 | Briere | H01L 29/778 257/194 |

* cited by examiner

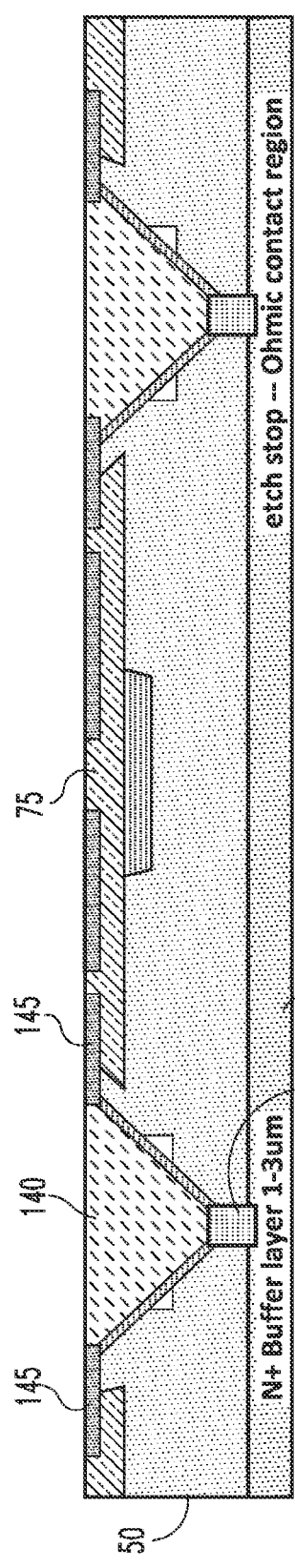
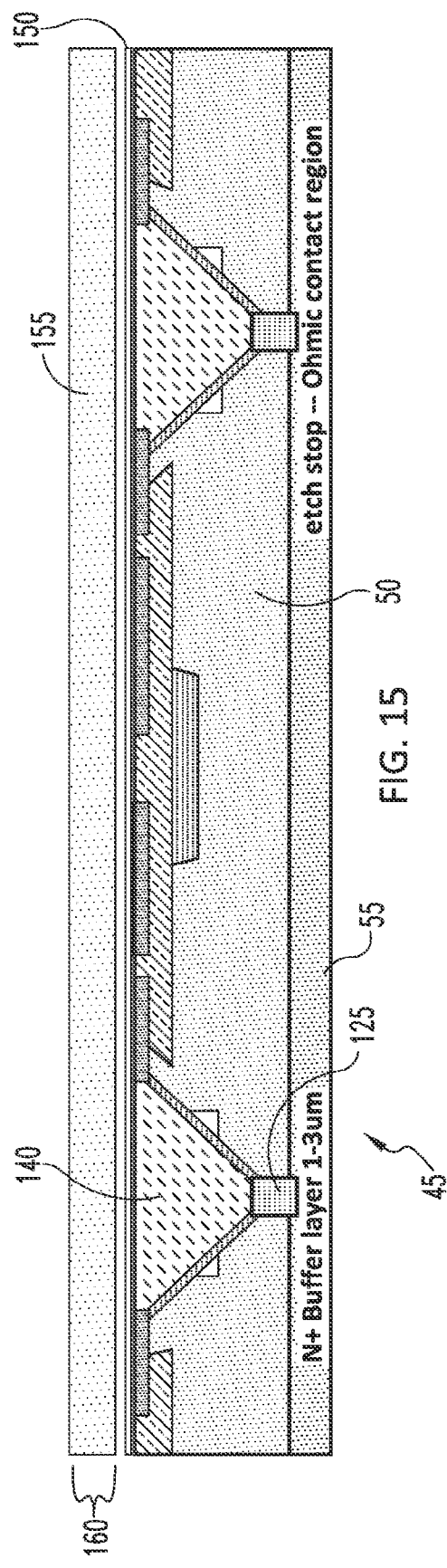
FIG. 14
FIG. 15

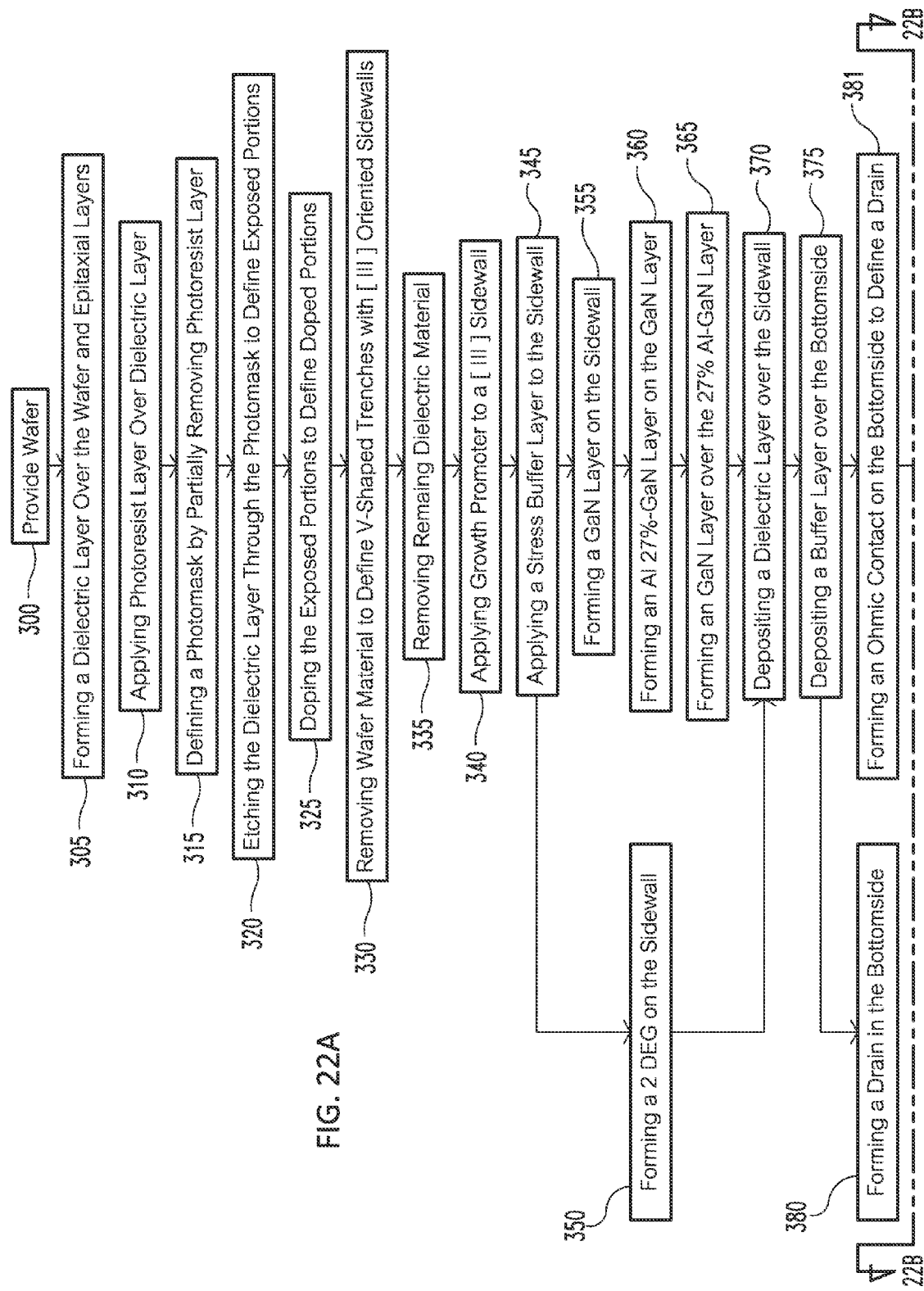

| Cross Ref. No. | Layer / Film Type | Material Composition | Layer / Film Typical | Ref. No. |
|---|---|---|---|---|
| 1 | Top-side Passivation | Silicon Nitride | 4-8KA | 1 |
| 2 | Top-side Metal | Aluminum | 4-6um | 2 |
| 3 | Inter-dielectric | Polyimide | 5-300um | 3 |
| 4 | 2DEG Passivation | Silicon Nitride | 1-4KA | 4 |
| 5 | Gate Electrode(s) | Ni/Au | 1-10KA | 5 |
| 6 | 2DEG Metal(s) | Ti/Al/Au | 1/2/1KA | 6 |
| 7 | Substrate | Silicon (100,110) - Undoped or P~$10^{15}$/cm$^3$ | 1-100um | 7 |
| 8 | 2DEG Films | See Figure | | 8 |
| 9 | Cap Layer | GaN Undoped | 10-20A | 9 |
| 10 | GaN 2DEG | Al(25%)/Ga(75%)N | 100-500A | 10 |
| 11 | Buffer Layer(s) | Al(x%)Ga(y%)N (X+Y =100%), GaN | 1-5um | 11 |
| 12 | Neuculation Layer | AlN, AlN/GaN | 1-3KA | 12 |
| 13 | Drain Electrode | Ti/Ni/Ti/Ag | 1/6/2/1KA | 13 |
| 14 | GaN Via Passivation | Silicon Nitride | 4-8KA | 14 |
| 15 | GaN Via Metal(s) | Ti seed / Ni Plating | 4-10um | 15 |

FIG. 23

TRENCH HIGH ELECTRON MOBILITY TRANSISTOR DEVICE

CROSS-REFERENCE TO RELATED APPLICATIONS

This utility patent application claims priority to U.S. provisional patent application Ser. No. 61/836,338, filed on Jun. 18, 2013, and U.S. provisional patent application Nos. 61/858,850, filed on Jul. 26, 2013; 61/867,288, filed on Aug. 19, 2013; and Ser. No. 62/007,637, filed on Jun. 4, 2014, all of which are incorporated herein by reference.

TECHNICAL FIELD

The present invention relates generally to electronic devices, and, more particularly, to multilayered High Electron Mobility Transistor (HEMT) devices and their method of manufacture.

BACKGROUND

For decades the world has enjoyed the advancements seen from the development, and production implementation of numerous III/V and II/VI compound semiconductors. The High Electron Mobility Transistor type is fabricated with, and makes use of a Two (2) Dimensional Electron Gas (2DEG), such as formed from an Al(x)Ga(1−x)N/GaN heterojunction. Generally, to obtain high currents, and high frequency operation for a given semiconductor device, a high charge carrier mobility (u), along with a high saturation velocity (vsat) needs to be developed by the transistor device structure. When reviewing the high electron mobility that GaAs (u~8,500 $cm^2$/V*S) based HEMT's offer, the carrier mobility, clearly indicates the primary reason that HEMT device structures exhibit superior high-frequency performance. The mobility and saturation velocity of the aforementioned (2DEG) at the Al(x)Ga(1−x)N/GaN heterojunction is shown at room temperature to be typically between 1,200 $cm^2$/V*S and 2,000 $cm^2$/V*S, which is more than adequate for superior high-power and high-frequency transistor device operation. When reviewing the (2DEG) sheet charge density (ns) of the Al(x)Ga(1−x)N/GaN structure again showing to be extremely high (~$1e^{13}$/$cm^2$), due to the strong piezoelectric and spontaneous polarization induced effects. Where this heterojunction provides the ability for the design of high frequency, voltage, current, and conductance HEMT devices. Additionally, In(x)Ga(1−x)N/GaN heterojunction compound semiconductor films are used to produce Multiple Quantum Wells (MQWs) to enhance recombination/generation of electron/hole pairs for the operation of typical Light Emitting Diodes, and Photovoltaic Cell devices. These devices have been fabricated in the horizontal or lateral plane of the semiconductor, and have resulted in device structures that have been refined and improved over the course of decades.

However, traditional HEMT devices still suffer from several drawbacks. While more thermally efficient than their predecessors, HEMT devices still suffer from limitations imposed by waste heat generated from power handling and their thermal dissipation rates, current handling capacity, channel width, tunneling, and various unwanted leakage currents. Thus, there is clearly a need for an improved HEMT device structure. Today's LED and Photovoltaic Cell devices can be limited in their light generation or absorption due to the fixed lateral surface area and plane of these typical device structures. Additionally, absorption losses within the bulk LED material(s), Fresnel losses, and Critical Angle losses, have shown through experimentation to be the major factors that prevent light generation. These locally generated photons through forward biased Injection Electroluminescence can be rejected/absorbed from having the opportunity of being externally illuminated from the device surface. Indicating a clear need for future semiconductor innovation, towards the development of additional compound semiconductor power, and optical device improvements. The present novel technology addresses these needs.

SUMMARY

The present novel technology relates to an improved HEMT design. One object of the present invention is to provide an improved HEMT device and method for its manufacture. Related objects and advantages of the present invention will be apparent from the following description.

BRIEF DESCRIPTION OF THE DRAWINGS

FIGS. 1-25 illustrate a compound semiconductor vertical Trench High Electron Mobility Transistor (THEMT) 10, as well as related devices 10 built on this platform, and a method to produce the same that includes an array 15 of Two-Dimensional Electron Gas (2DEG) trench structures 20, some including selectable Transfer Enhancement Mode Lateral DMOS Silicon based structures 25, and including top-side Source and Gate contacts 30, 35, and a bottom-side or reverse side Drain contact 40.

DETAILED DESCRIPTION OF THE PREFERRED EMBODIMENTS

Figure 1:
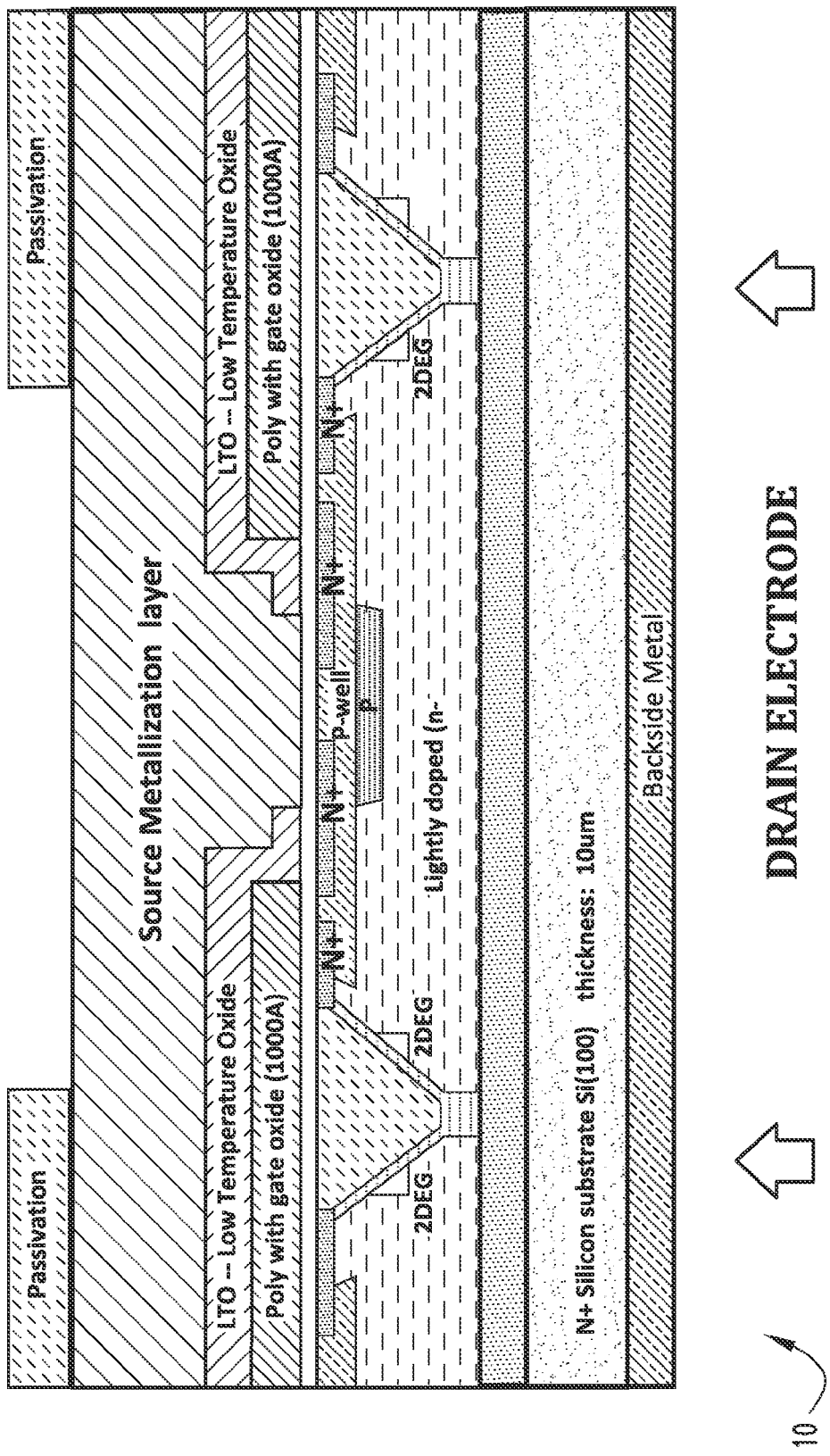
Figure 2:
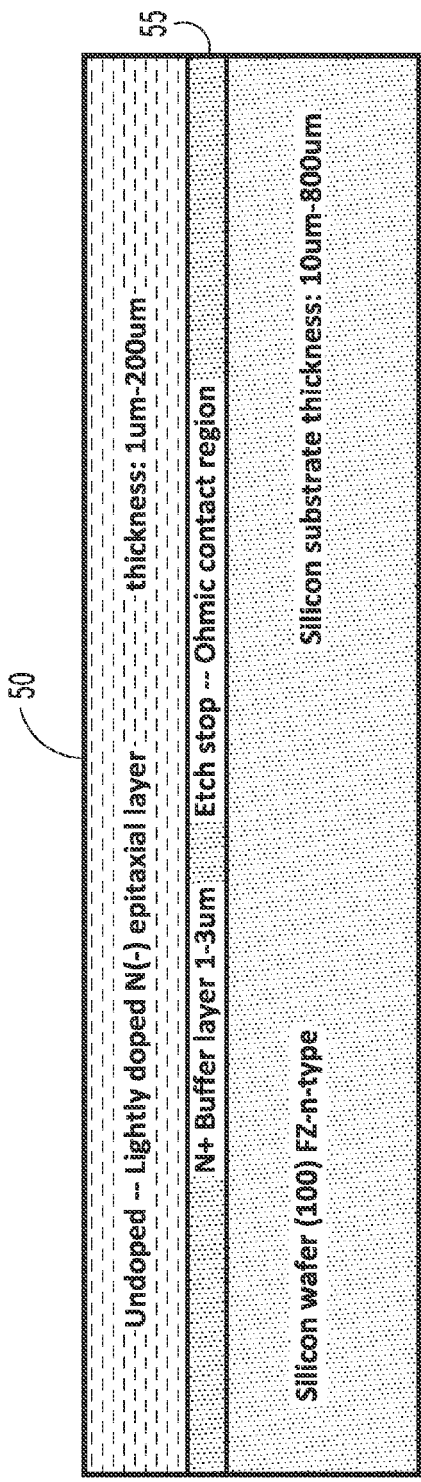
Figure 3:
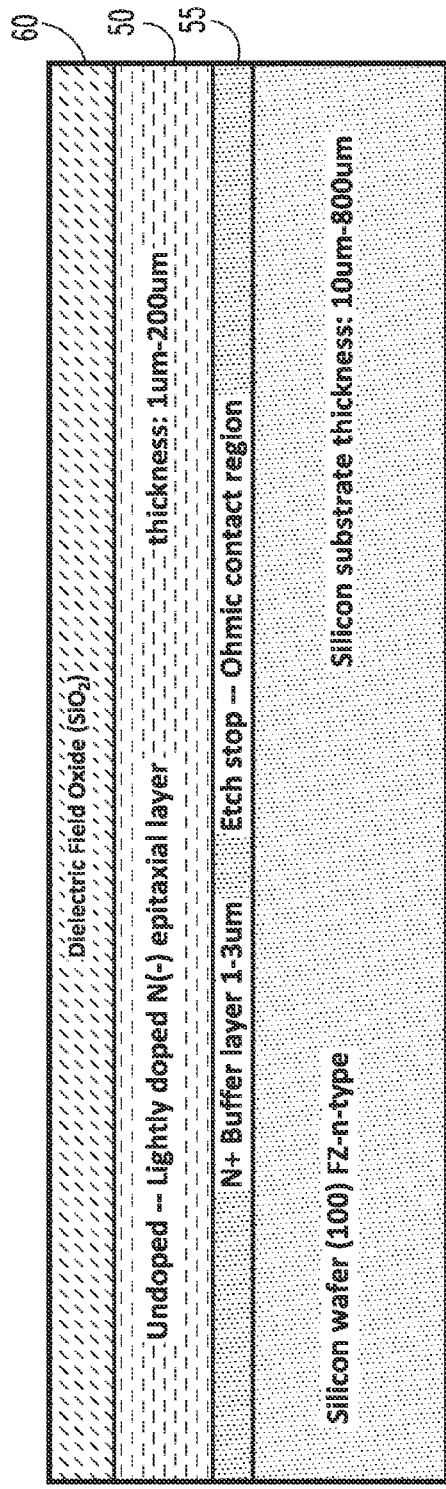

For the purposes of promoting an understanding of the principles of the invention and presenting its currently understood best mode of operation, reference will now be made to the embodiments illustrated in the drawings and specific language will be used to describe the same. It will nevertheless be understood that no limitation of the scope of the invention is thereby intended, with such alterations and further modifications in the illustrated device and such further applications of the principles of the invention as illustrated therein being contemplated as would normally occur to one skilled in the art to which the invention relates.

OVERVIEW

In general, the present novel technology relates to the further advancement of GaN or like compound semiconductor devices formed on Silicon substrates. Novel processing methods further exploit the GaN-type compound semiconductor. One or more single heterojunction(s) or multiple heterojunction(s) are formed on a Silicon or like substrate, typically as one or more $Al_{(x)}Ga_{(1-x)}N$/GaN structures, or structures and compositions similar thereto to generate and exploit a series of spontaneous and stress induced 2 Dimensional Electron Gases or (2DEGs), oriented parallel to the Si (111) plane(s).

Given a Hexagonal Wurtzite (WZ) or Cubic GaN crystal orientation and face termination scheme, the 2DEG may be fabricated along an etched Silicon (111) face/surface structure. By use of this novel fabrication method, a 2DEG conduction path may be achieved along vertical or nearly vertical plane, grove, or trench structures.

The GaN 2DEG crystal orientation may then be engineered into the Si/GaN/AlGaN/GaN compound semiconductor device, or similar. By use of chemically controlled Silicon etch planes and substrate orientation, a vertical or steep-angle Trench High Electron Mobility Transistor (THEMT) may be achieved (hereinafter 'vertical' for convenience). Such devices allow for significant improvement in electronic device performance for power, current, voltage, temperature, and switching speed. Further other technologies, such as sensors, accelerometers, integrated circuit design elements/devices, biomedical sensors may be developed using the novel fabrication method. In general, the novel technology gives rise to a host of devices that are stress and/or conductivity and/or polarization dependent. Magnetic properties may also be exploited in the crystal orientation properties related to an etched Silicon or GaN substrate surface orientation.

The ability to perform bandgap engineering with InGaN over a range that provides a good solar spectral match to sunlight, makes $In_{(x)}Ga_{(1-x)}N/GaN$ suitable for Solar Photovoltaic Cells. It is possible to grow multiple layers with different bandgap energies, as the material is relatively insensitive to defects introduced by a lattice mismatch between the layers and substrate materials. A two-layer or multi-junction cell with bandgap of 1.1 eV and 1.7 eV can theoretically reach 50% maximum efficiency, and by depositing multiple layers tuned to a wide range of bandgap energies an efficiency up to 70% is theoretically expected.

Similarly, an $Al_{(x)}Ga_{(1-x)}N/GaN$ heterojunction structure, or structures and compositions similar thereto to generate and exploit a series of spontaneous and/or piezoelectric stress induced Two Dimensional Electron Gases (2DEGs) oriented parallel to the Si (111) plane. Given a Hexagonal Wurtzite (WZ) GaN crystal orientation and face termination scheme, the 2DEG may be fabricated along an etched Silicon (111) profile/plane/surface structure. By use of this novel fabrication method, a (2DEG) conduction path, piezoelectric film, or Multiple Quantum Well, as example may be achieved along vertical or nearly vertical plane, grove, or trench structures.

The desired substrate crystal orientation for an $Al_{(x)}Ga_{(1-x)}N/GaN$ (2DEG) film structure, and/or $In_{(x)}Ga_{(1-x)}N/GaN$ (MQW) or like structures may then be engineered into various group III/Nitride compound semiconductor devices. By use of chemically controlled Silicon etch planes and substrate orientation, a vertical or steep-angle Trench High Electron Mobility Transistor may be achieved. Thus, allowing for significant improvement in electronic device performance for power, current, voltage, temperature, and switching speed. Further other technologies, such as Solar Photovoltaic Cells, Light Emitting Diodes, Laser Diodes, Laser elements, mechanical sensors, biomedical sensors, accelerometers, complex monolithic integrated circuit design elements/devices, may be developed using this novel fabrication method. In general, the novel technology gives rise to a host of devices that are piezoelectric stress and/or spontaneous conductivity and/or polarization dependent.

Additionally, device structures can have Photoluminescence, and/or Electroluminescence and/or Optoelectric properties which may also be exploited in the type III/Nitride crystal properties related to an etched Silicon or other etched substrate surface orientation.

FIGS. 1-25L illustrate a compound semiconductor vertical Trench High Electron Mobility Transistor (THEMT) 10, as well as related devices 10 built on this platform, and a method to produce the same that includes an array 15 of Two-Dimensional Electron Gas (2DEG) trench structures 20, some including selectable Transfer Enhancement Mode Lateral DMOS Silicon based structures 25, and including top-side Source and Gate contacts 30, 35, and a bottom-side or reverse side Drain contact 40.

The typical wafer starting material (see FIG. 2) is a uniformly doped N+ type Silicon substrate 45, although other like semiconductive materials may be selected. More typically, the substrate 45 is doped N+ type Silicon with an N-type lightly doped or undoped epitaxial Si layer 50, and if desired a N+ buffer layer 55. Alternately, combinations of P/N type wafers with or without N/P type epitaxial layer(s) 50, and/or N+ buffer layer 55 may also be selected as the substrate 45. Wafer diameter and thickness may be selected based on manufacturing equipment requirements. The typical wafer orientation is Si(100), or Si(110), but other orientations may also be used. For example, a P-type substrate 45 with N-type epitaxial layer 50, and N+ buffer layer 55, may be used to build an IGBT type power device. Unless otherwise indicated, discussion will focus on one exemplary embodiment device 10 having an N/N+ type substrate Si(100) 45 with lightly doped N-epi 50, without limitation or exclusion of other device formats, such as an un-doped, or lightly Phosphorus doped N-type Prime Si(100) substrate 45 layer which may be exploited for TLED 10, TPC 10, or THEMT 10 with Vds ~1,000V. This example substrate material 45 allows for oxide growths, deposited films, etches, diffusions, ion implantation, inter-dielectrics, metal layers, or the like. Additionally, backside thinning of about 2-5 mils, backside Silicon etching, dielectric deposition, and/or metallization manufacturing processes may be employed. The process of optimal substrate 45 specifications is typically achieved through matrix lot runs and/or selective application of these factors.

An N+ substrate 45 with a N+ buffer layer 55 of about 1-3 um in thickness and a 70 um expitaxial intrensic (or very lightly doped n-type), layer 50 yields up to $10^{18}/cm^3$ carriers which may be exploited may be produced for voltage transistors 10 (Vds)=50V-1,000V. The N+ buffer layer 55 is typically used as an etch target region for the 2DEG layer Si(111) plane/surface, and also to be used as an ohmic contact region for the bottom side Drain connection 40. A very lightly doped N-type epitaxial region 50, along with the doping of the P+/P-well of the Silicon Transfer FET, are factors that help increase the breakdown voltage of the device 10. This example substrate material 45 allows for backside thinning of about 2-20 mils, backside dielectric(s), and backside metallization manufacturing processes. The process of optimal substrate 45/epitaxial 50/buffer 55 specifications are typically achieved through matrix lot runs/selection of these general controlling factors.

Next, a field oxidation or nitridation step is typically performed to grow an oxide or Nitride layer 60 atop the epitaxal layer 55. The oxide or Nitride layer 60 is typically $SiO_2$, Silicon Nitride ($Si_3N_4$), or any suitable wet/dry dielectric material (see FIG. 3). The thickness of the oxide layer 60 can very from a few Angstroms to several microns. The oxide layer 60 is typically around 5K Angstroms or 0.5 microns in thickness. The dielectric layer 60 in this case is a layer of $Si_3N_4$.

Figure 4:
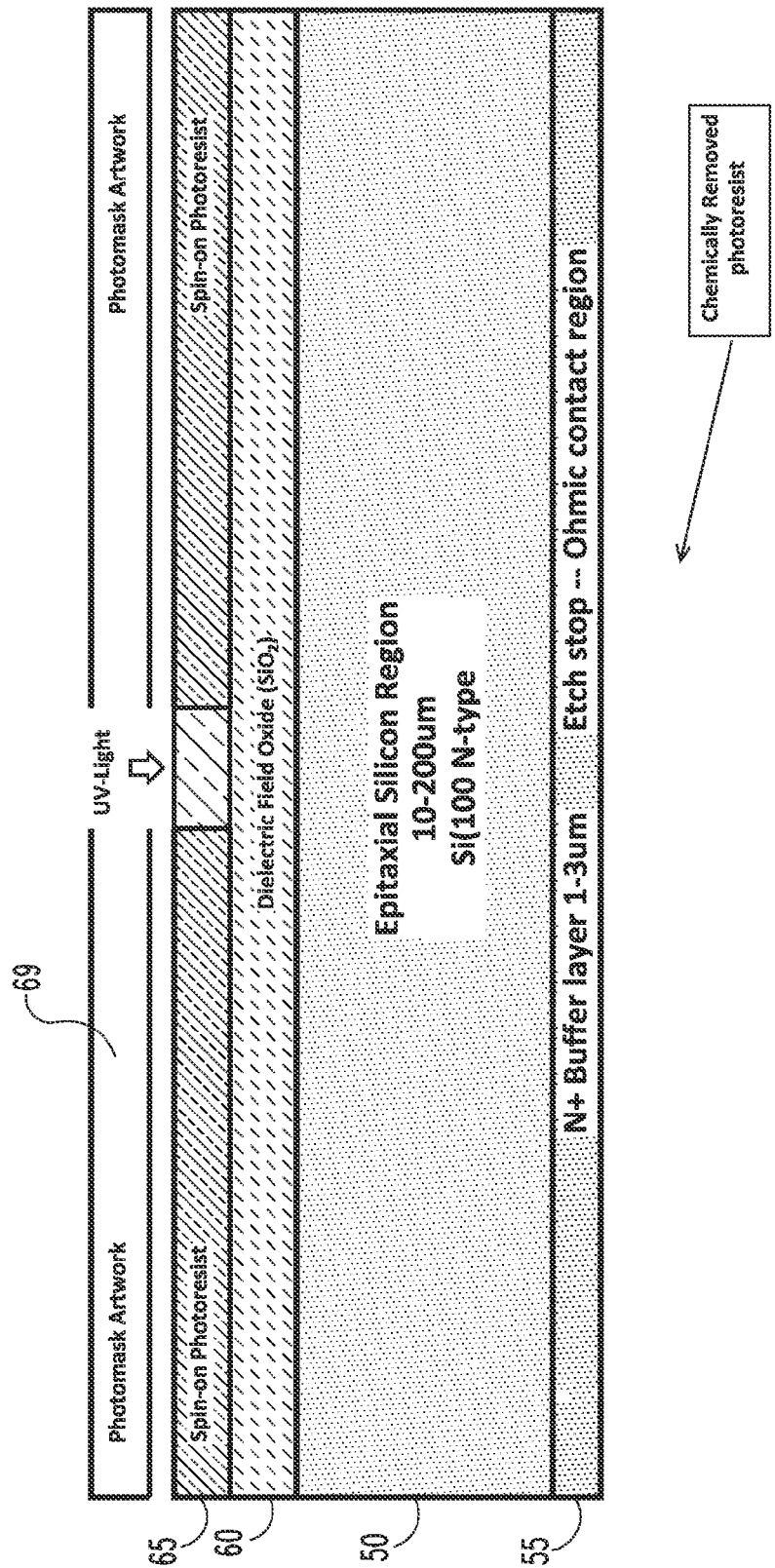

As seen in FIG. 4, a general photomask operation is typically next used to pattern a photosensitive material or resist layer 65. The photoresist layer 65 is typically spun atop the dielectric layer 60 on the wafer surface, and photolithography, or optical lithography/UV lithography is typically used to expose the underlying photoresist material 65. The unhardened photoresist material 65 is then chemically removed, defining a "negative photoresist pattern" having a predetermined shape. A similar technique can be employed using a positive bias photoresist, as is also standard to the Art if desired to facilitate the design.

Figure 5:
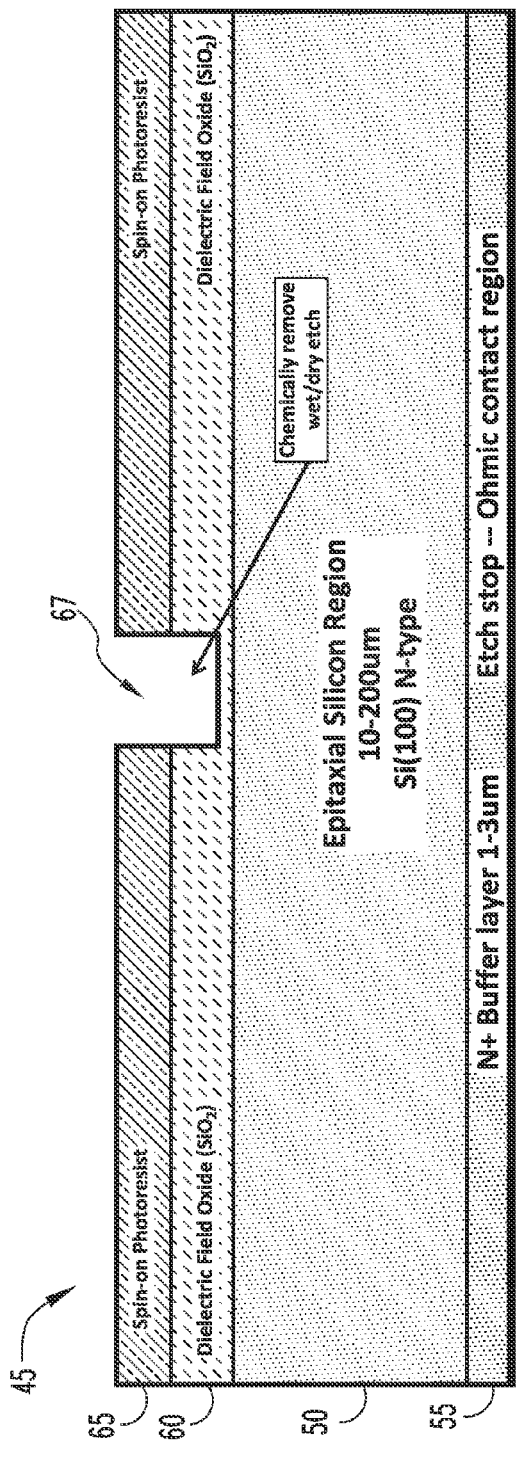

As illustrated in FIG. 5, the wafer is then selectively etched, such as by exposure to a wet or dry etch, which may completely remove or reduce in thickness the exposed dielectric layer 60 underlying the "negative photoresist pattern" and having the predeterminded shape to define an exposed portion 67. In some cases the exposed dielectric surface 60 may not be etched before the next process operation, having the hardened patterned photoresist also acting as the barrier to the next process.

Figure 6:
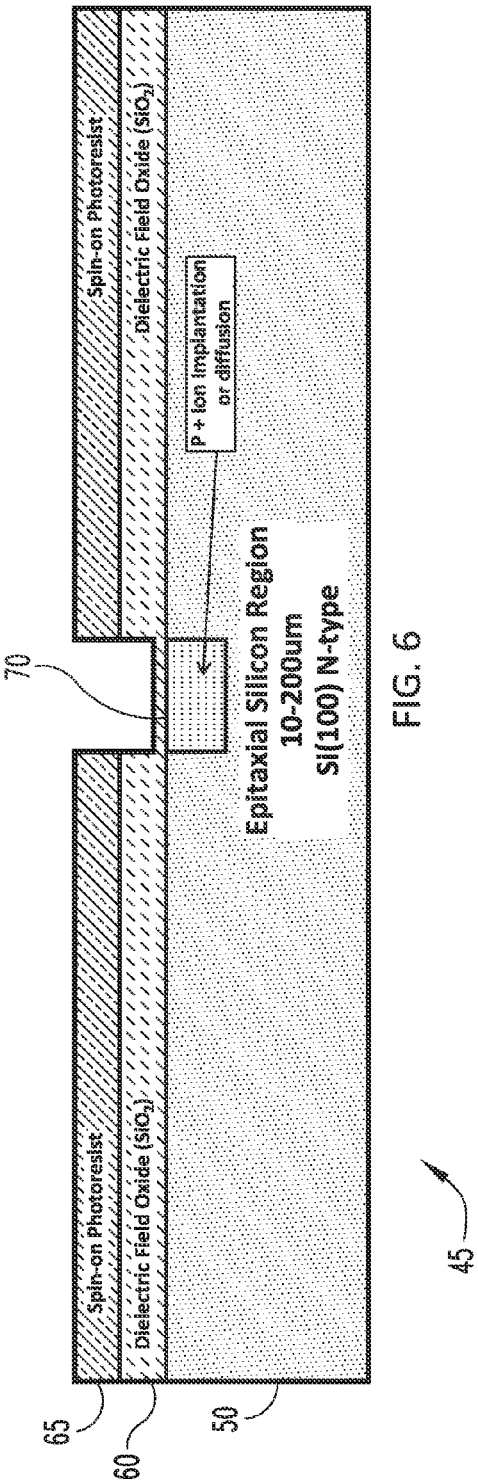
Figure 7:
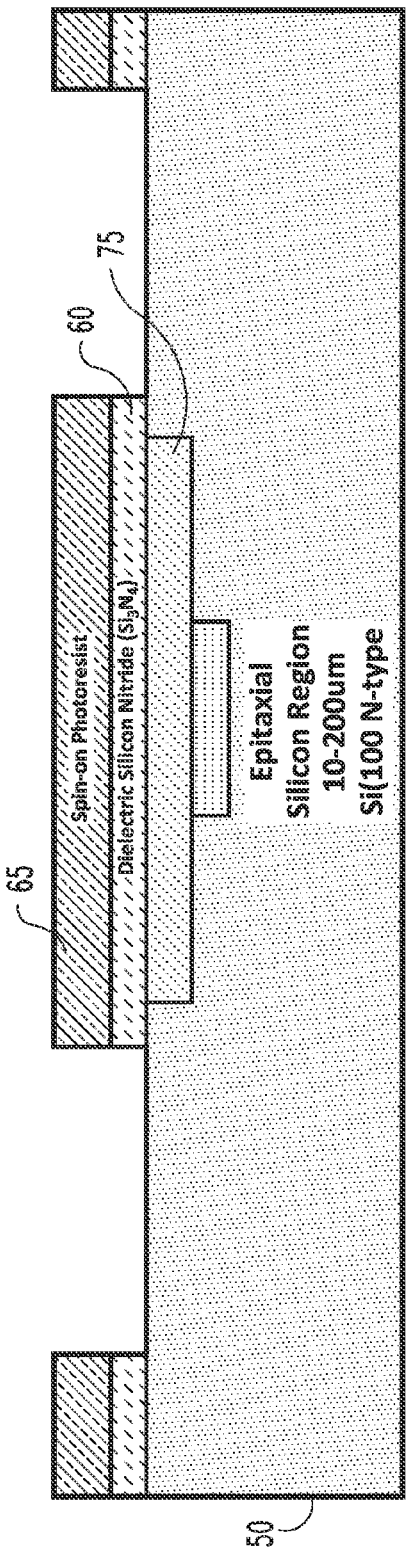
Figure 8:
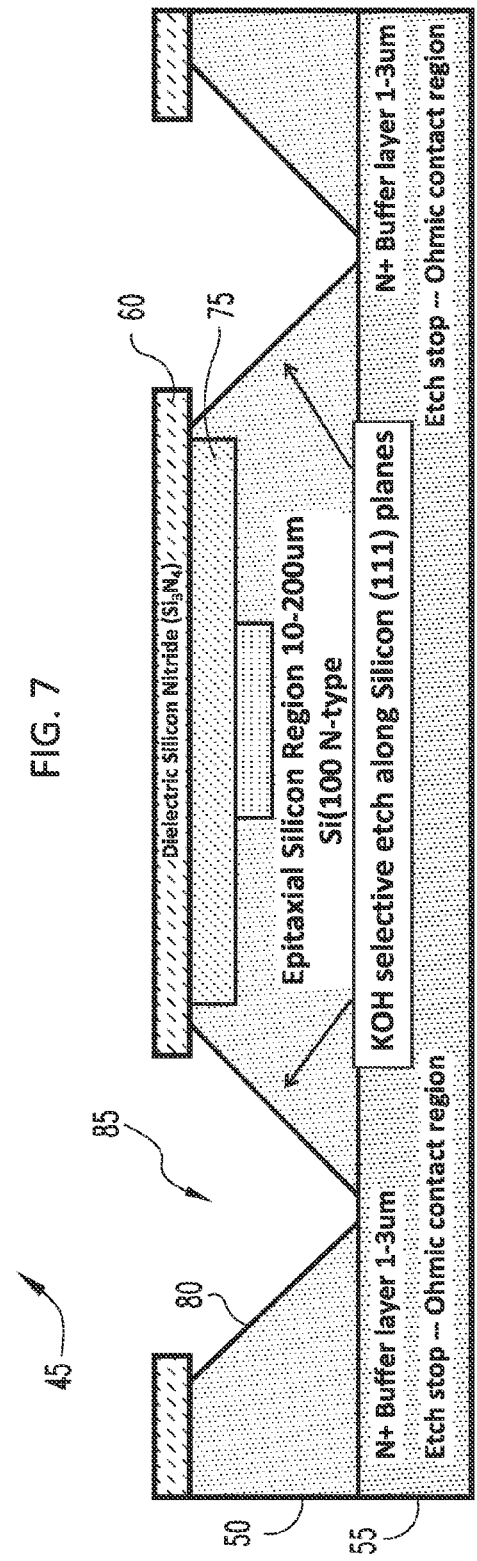
Figure 9:
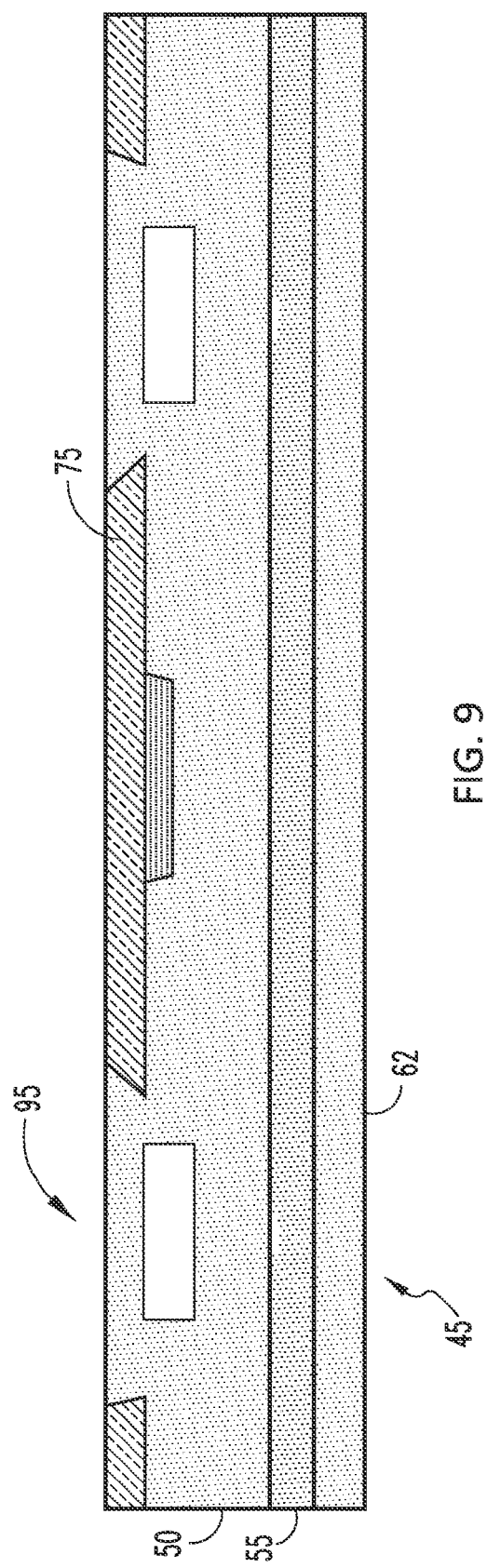

As illustrated in FIG. 6, the substrate 45 is then ion implanted/diffused as desired, in this example with a P+-type dopent 70 such as Boron and of a typical dosage level of about $10^{16}$-$10^{20}$ dopents per cm$^3$ to a typical depth of about 0.1-5 micrometers, depending on the desired transistor blocking voltage. The P-type dopents 70 are provided to be additionally annealed or diffused, and/or can be left unactivated to out-diffuse during subsequent thermal operations, so as to provide an adequate electrical ground for thermally generated holes, and to help provide $V_{DS}/I_{DS}$ reverse blocking capability for the transistor 10.

Next in the similar manner as above the wafer is cleaned and prepared for a $2^{nd}$ masking layer, by forming an additional 5 KA layer of $Si_3N_4$, with masking of photoresist, and etching of exposed dielectric material to provide regions for a P-type ion implantation/diffusion is typically performed to generate a lightly doped P− layer 75. Typically a dopent density of about $10^{13}$-$10^{18}$ dopents 20 per cm$^3$ to a depth of about 0.1-5.0 micrometers layer at the surface of the Silicon is achieved to provide for an enhancement mode N-channel layer used to control the flow of electrons when the device 10 is on. This layer 75 typically outwardly diffuses during succeeding thermal operations as previously discussed. As can be seen the dielectric oxide, masking/etch operations, and ion implanting/thermal diffusions of various P/N type dopants can be repeated to define complex device types or process modules as desired standard to the Art of semiconductor manufacturing.

Next, a Silicon trench etch surface substrate 45 is prepared for anisotropic Silicon wet etching 80. In the similar manner as above the wafer is cleaned and prepared for a 3rd Silicon hard etch masking layer. This is performed by forming an additional 5 KA layer of $Si_3N_4$, with masking of photoresist, and etching of exposed dielectric material to provide regions exposed for anisotropic Silicon wet etching. This dielectric layer is photo-masked and dielectric etched to expose the underlying Silicon material for this etching process 80.

The Self-Limiting Stable Profile (SLSP) anisotropic Silicon etch is typically a KOH/TMAH/EDP based etch, or similar Si(111) selective Silicon etch 80. The anisotropic wet etching of Silicon along the Si(111) Self-Limiting Stable Profiles is a well-established standard etch method. Etching a Si(100) surface through a 100 um rectangular hole using a SLSP designed photo-mask, for example, a rectangular hole in a layer of Silicon Nitride typically creates an inverted trapezoidal pyramidal shaped etch pit with flat sloping Si(111)-oriented sidewalls and a flat (100)-oriented bottom. The Si(111)-oriented sidewalls typically have an angle to the surface of $\tan^{-1}\sqrt{2}=54.7°$. If the etching is continued until the flat bottom disappears, the SLSP shapes/surfaces becomes a SLSP inverted trapezoidal trench with a Si(111) surface V-shaped cross section. If the original rectangle was a 100 um perfect square, the initial shape when etched to completion enjoys a SLSP inverted pyramidal shape of about 70 um deep.

When etching the Self-Limiting Stable Profile Si(111) planes, in the presence of a P-type dopant, such as Boron, will greatly reduce the etch rate, and may prevent etching all together. This etch behavior may be used to facilitate the design as in the case with AlGaN/GaN piezoelectric biosensors, or force sensing elements related to compression/strain/ shear, or etch stop protection during wet etching as examples. Etch rates are generally developed and optimized for surface roughness, and etch precision through experimentation, and process matrix selection standard to the art of micro-electro-mechanical structures fabricated in Silicon.

Typically, the wafer substrate 45 is next stripped of the hard dielectric masking material (i.e., Silicon Nitride, Low Temperature Oxide film (LTO), or similar) such as by use of plasma etching, wet etching, or the like. The wafer 45 is then stripped of any additional native oxides or surface contaminates to provide a clean, smooth etched surface for Metal Organic Chemical Vapor Deposition (MOCVD) or like process. In some cases, the dielectric/oxide layer may not be stripped or partially etched to provide for a method to selectively mask or prevent compound semiconductor film growth as desired. Additionally, heating to 1,000° C.-1,100° C. can be used or budgeted to help thermally diffuse the dopants 70 towards the edges of the Silicon etched Si(111) planes 90 filling out the top surface 61 if desired, and to 0.1-10 micrometers below the top surface 61 of the Silicon substrate 45 as needed depending on the desired $V_{DS}$ breakdown requirements (see FIG. 9). This is when the major thermal budget for the P-type well, and P+ grounding structures/ diffusion are performed. The wafer 45 is then stripped of any native oxides or surface contaminates to provide a clean etched surface 95 for Metal Organic Chemical Vapor Deposition (MOCVD), or similar deposition technique.

Next after wafer cleaning, the wafer material is then MOCVD deposited with various III/Nitride high temperature films to form the 2DEG regions. Other methods may include any method known or unknown future developed techniques appropriate for the material to be deposited including but are not limited to, chemical vapor deposition (CVD), low-pressure CVD (LPCVD), plasma-enhanced CVD (PECVD), semi-atmosphere CVD (SACVD) and high density plasma CVD (HDPCVD), hydride vapor phase epitaxial (HVPE), rapid thermal CVD (RTCVD), remote processing CVD (RPCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitration, spin-on methods, physical vapor deposition (PVD), atomic layer deposition (ALD), chemical oxidation, molecular beam epitaxy (MBE), plating, evaporation or like processes/tools/methods. It should be appreciated that many different processes/tools/methods may be used, by which a compound semiconductor material 43 and/or other film can be grown or deposited on an etched Si substrate or like substrate material. These film structures would include, but are not limited to: nucleation layer(s), stress relief buffer layer(s), defect reduction layer(s), and bulk layer(s) composed of AlN, $Al_2O_3$, GaN, AlGaN, InGaN, TiO, GaAs, ZnO, SiC, or like compounds.

Nucleation layers that can be formed over etched Silicon substrate include Aluminum Nitride (AlN), Silicon Nitride ($Si_3N_4$), Silicon Carbide (SiC), Rare Earth Oxide (REO), AlGaN, GaN, ZnO, or $Al_2O_3$ as example. An etched substrate may include a number of materials, including Si, Ge, Ga, SiC, and those consisting essentially of one or more III-V compound semiconductors having a composition defined by the formula $Al_{X1}Ga_{X2}In_{X3}As_{X4}P_{X5}N_{X6}Sb_{X7}$, where X1, X2, X3, X4, X5, X6, and X7 represent relative proportions, each greater than or equal to zero and sum=1 (1 being the total relative mole quantity). Other materials include II-VI compound semiconductors having a composition $Zn_{X1}Cd_{X2}Se_{X3}Te_{X4}$ where X1, X2, X3, and X4 represent relative proportions, each greater than or equal to zero and sum=1 (1 being the total relative mole quantity). In addition, an etched substrate may be doped with either an N-type impurity and/or P-type impurity in a conventional manner. As example N-type Silicon dopants may include but are not limited to: Phosphorous (P), Arsenic (As), Antimony (Sb), while P-type Silicon dopants may include but are not limited to: Boron (B), Indium (In) and Gallium (Ga). Single-phased Ge, Si, Ga, or like semiconductors, and/or $SiO_2$, $Si_3N_4$, AlN, or like layers to reduce defect density, or film stress and/or multiple quantum wells (MQWs), such as $In_{(x)}Ga_{(1-x)}N/GaN$, for additional photon emission/frequency control, and the like.

Figure 10:
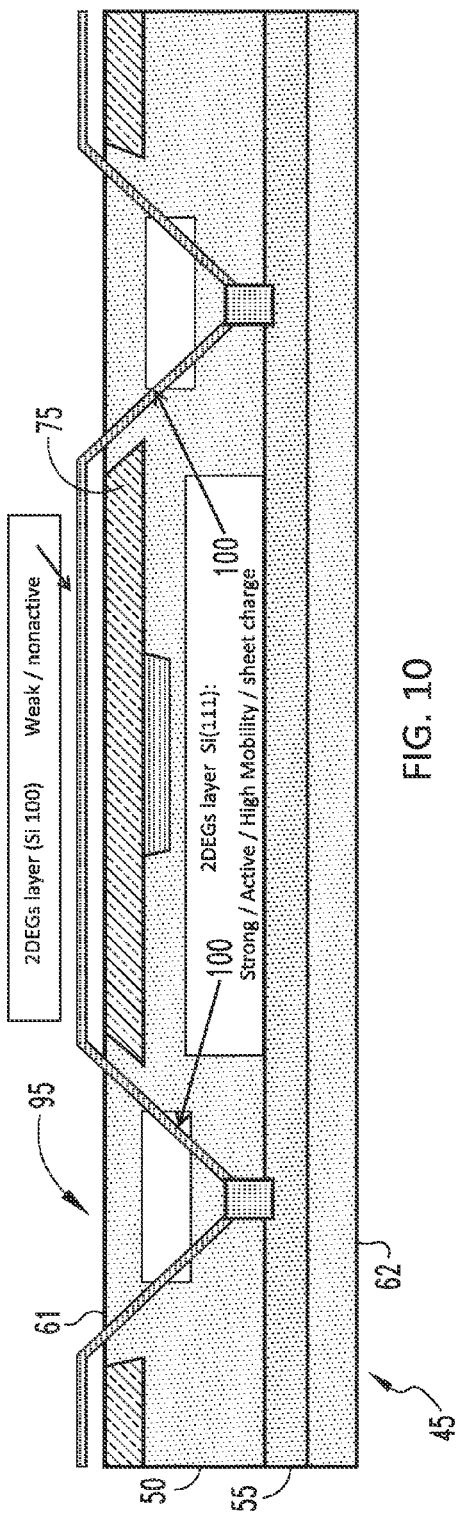

As shown in FIG. 10, high conductivity/mobility 2DEGs, high electron mobility layers or sheets 100 along the Si(111) trench plane/surface are created. The 2DEGs 100 are formed when the Ga face, or N faced GaN and AlGaN layers 105 are formed on the Si(111) plane as etched. For example, as layers of first $Al_2O_3$ (10 A-100 A) and/or, AlN (1 KA-3 KA) growth promoter 110, AlN and/or $Al_{(x)}Ga_{(1-x)}N$ and/or GaN stress buffer layer(s) (1 KA-10 um) 115, 2DEG(s): GaN (0.1-15 um), $Al_{(27)}Ga_{(73)}N/GaN$ (10-1000 A), with GaN cap layer (10-200 A) 105 are deposited, such as by MOCVD, one or more 2DEGs 100 then arise in the top 20 A-2 KA of the surface film structure.

Figure 11:
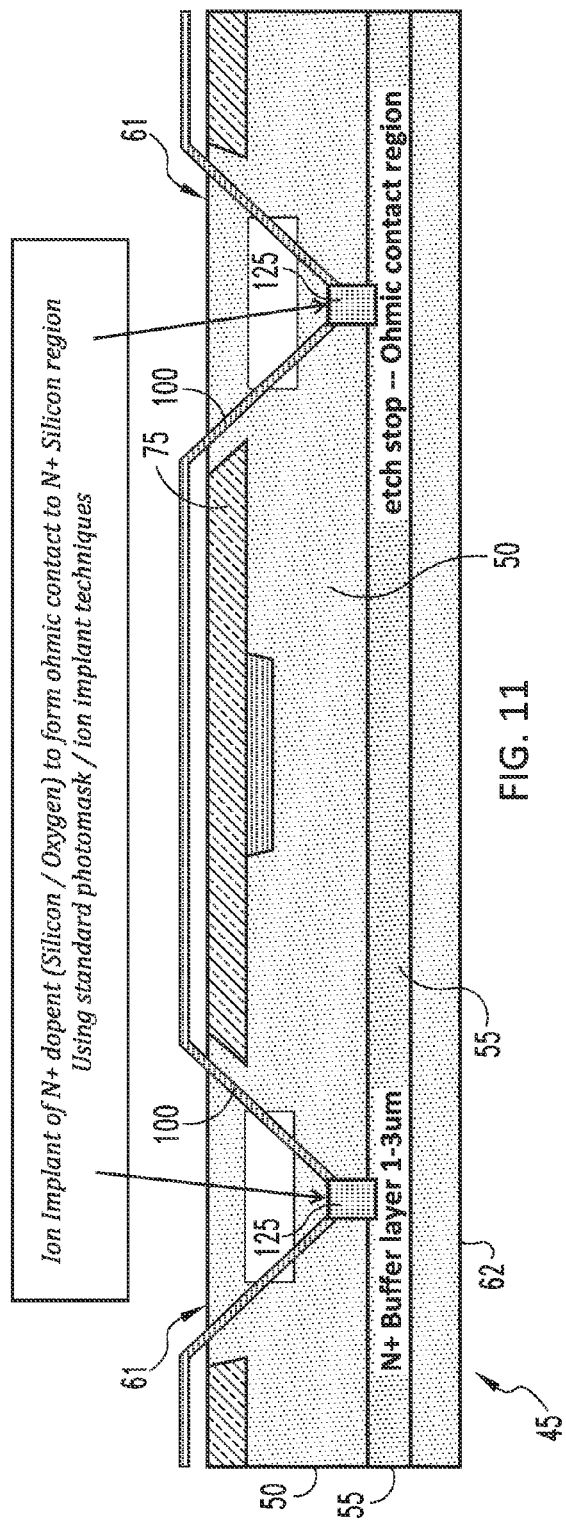
Figure 17:
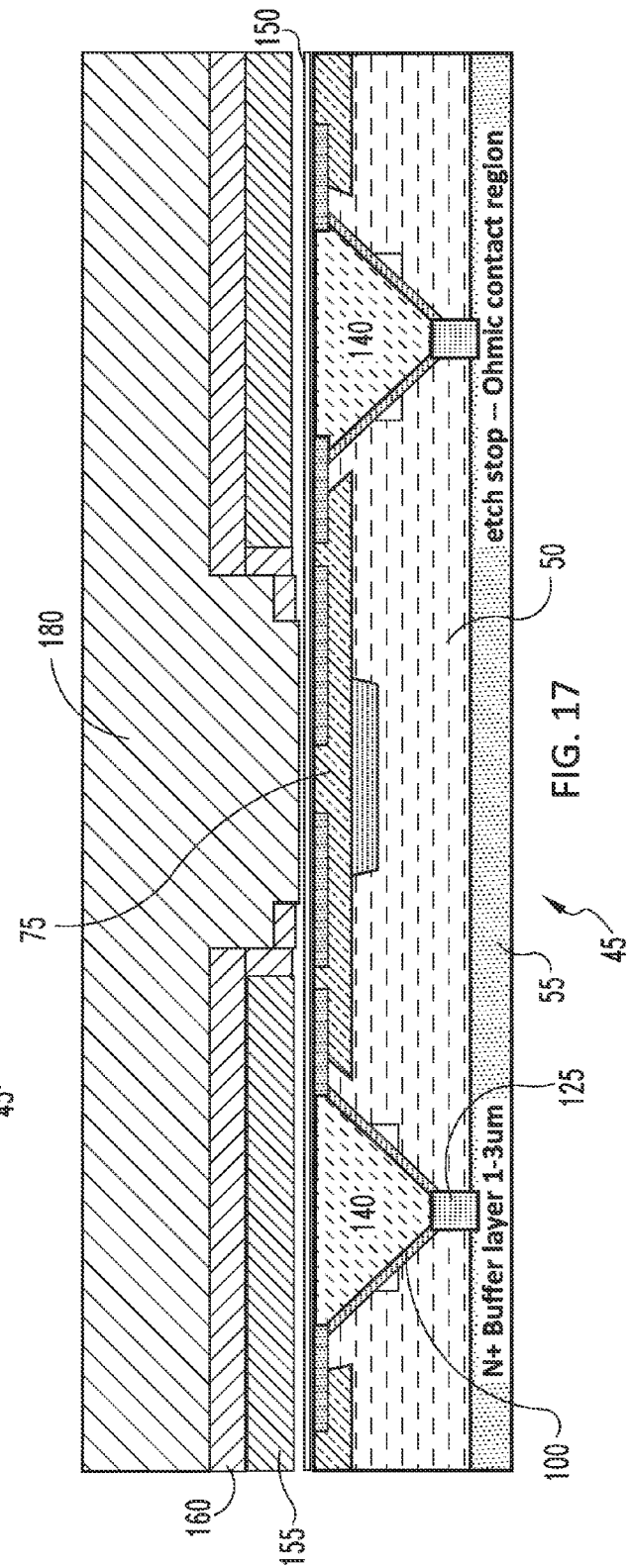

Typically, a protective Silicon Nitride ($Si_3N_4$) film 120 is next deposited (100 A-2000 A) to enhance 2DEG performance (FIG. 11). The $Si_3N_4$ film 120 and 2DEG film stacks are then selectively Deep Reactive Ion Etched (DRIE) to create a Gate mesa masking region using a $4^{th}$ standard photomasking operation. Standard etch methods are used to etch the 2DEG passivation, followed by dry $Cl_2/BCl_3$ GaN based etch methods to expose the underlying Silicon defining the Transfer Lateral DMOS transistor Gate structure regions. Next, about 500 A-1000 A of Gate oxide 150, and about 8000 A of poly Gate material 155 are typically applied to the wafer surface 45 (FIG. 15). The Gate oxide 150 and/or poly Gate material 155 are applied to define the enhancement mode ($V_{TH}>0$ v) Gate controlling electrode 160 using standard processing methods. Next, a $5^{th}$ masking layer is used to define, an N+-type implantation/diffusion, which is performed to generate a highly doped N+ layer regions 145 (see FIG. 14). Typically, a dopant density of about $10^{19}$-$10^{20}$ dopants per $cm^3$ to a depth of about 0.1-3 micrometers regions is achieved to define the Source/Drain N+ Ion Implant regions for the Transfer LDMOS FET structure. This is typically performed by wet and/or dry etching of the Polysilicon Gate, and Gate Oxide material layers, followed by shallow N+ ion implantation, and thermal activation of dopents. Next, a Low Temperature Oxide (LTO), or other suitable dielectric film, 60 is typically applied to insulate the poly Gate material 155 from the Source metallization 180 (FIG. 17). This dielectric material 60 is about 0.8 um-1.5 um in thickness. Next a $6^{th}$ masking operation is performed to define the burned Drain via regions. Wet and/or dry etches are used to etch the topside dielectrics and 2DEG passivation exposing the 2DEG GaN films, then followed by $Cl_2/BCl_3$ DRIE for GaN films/followed by Silicon Bosch DRIE to a depth of 5-30 ums as desired. The Drain vias are then followed by standard Ni plating using seed photoresist, or similar methods.

In this example the Drain metal vias are fabricated using standard Ti seed layer, and Ni plating operations to form ohmic contacts 125 to the N-epi 50 and/or N+ buffer layer 55, and 2DEG Drain connection region 135. If desired a N+ ion implantation can be incorporated before via metal to provide for enhanced ohmic contact 125 from 2DEG 100 to the Silicon material layers 50/55, and/or N+ substrate 45 if desired. After Drain via metal(s) formation, a separate 7th masking operation can be employed to provide contact regions by exposing for etching: LTO, Polysilicon Gate, Gate Oxide, and 2DEG passivation layers. This $7^{th}$ masking operation is to provide for 2DEG Source, 2DEG Drain and Drain via ohmic connection region 135. Also, this same $7^{th}$ masking operation provides for LDMOS Drain inter-connection to HEMT Source 2DEG contact regions. Thus, providing low ohmic contact regions for metal connections to burned Drain vias, topside HEMT Source, and LDMOS Drain inter-connection barrier metal(s). After contact etch formation, Ti/Al/Ni or similar metal(s) are deposited. Standard photoresist lift-off technique is employed to remove unwanted metal, followed by RTA of metal(s) as desired. An $8^{th}$ masking layer is used to disable the 2DEG films in the corner regions of the SLSPs to prevent unwanted leakage currents, and premature Vds breakdown. This ion implant typically makes use of one or more implant spies such as Nitrogen, Argon, or Iron. In this example case, Nitrogen implantation is used to disable the 2DEG conduction layer followed by RTA to activate the Nitrogen dopents. Next to follow is a $9^{th}$ mask, used to pattern HEMT Gate regions, by exposing the 2DEG topside film surface by wet and/or dry etching of dielectric materials including the 2DEG passivation, providing an exposed region suitable for Nickel Gate electrodes, or similar.

Next a 10th masking level is used to define the Gate Electrode metal pattern. This mask is then formed to pattern photoresist and Ni is deposited and then lift-off of photoresist followed by thermal anneal as desired to provide the Gate electrodes and additional interconnect/Gate metal via pads.

Figure 12:
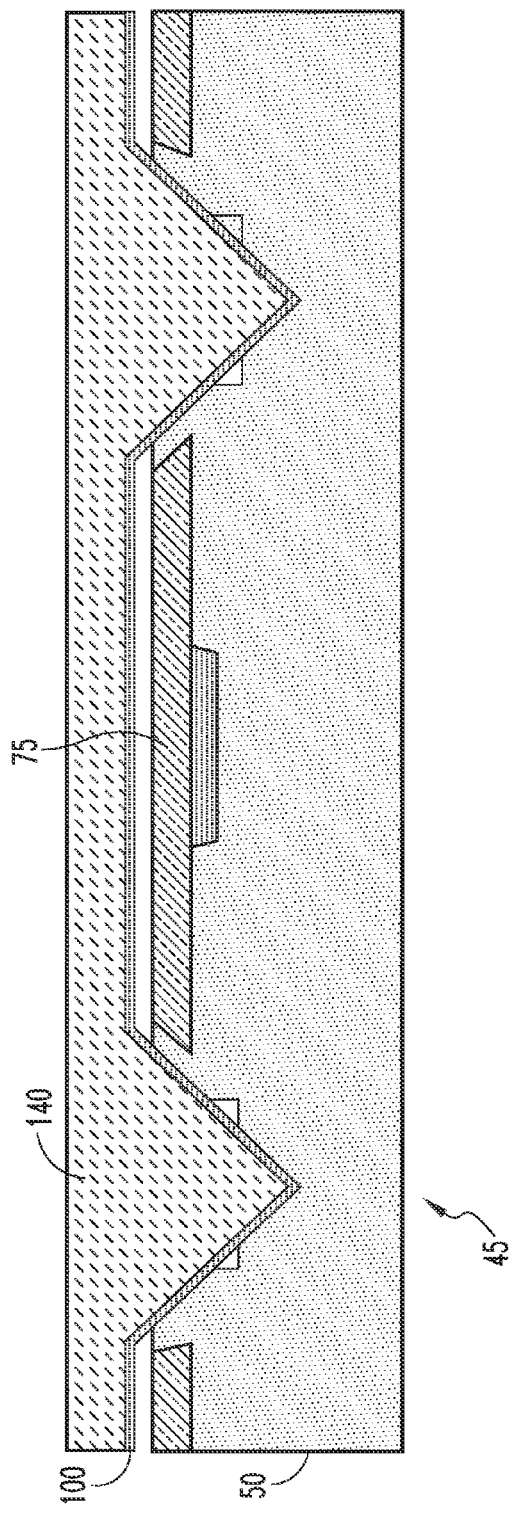
Figure 13:
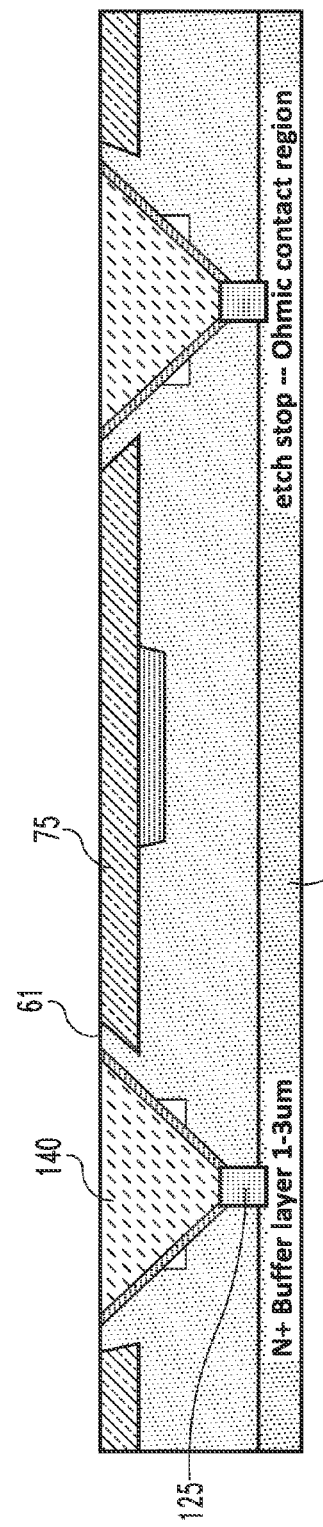
Figure 16:
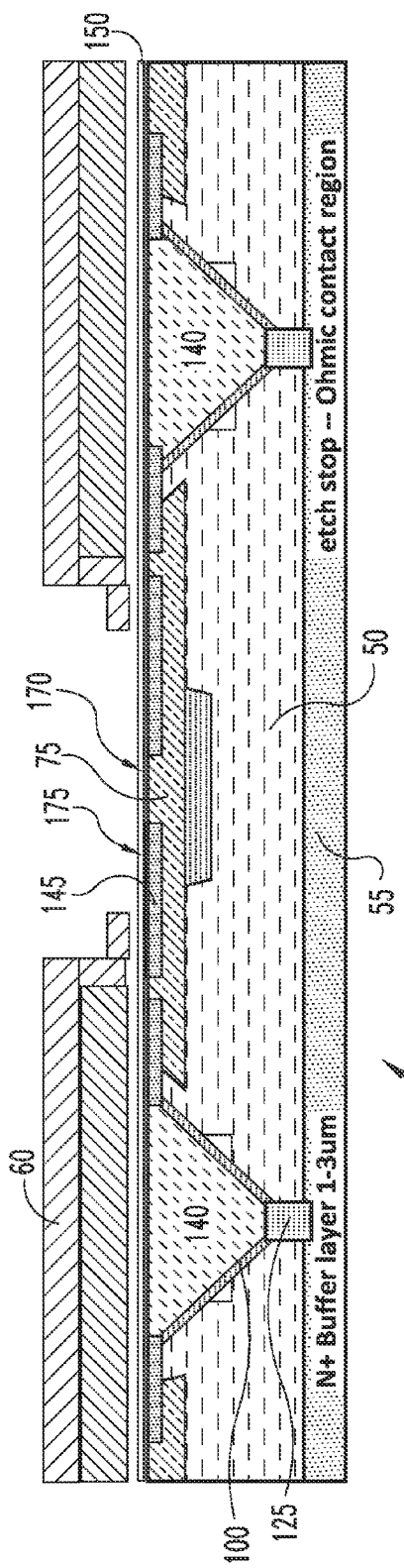

Typically, HSQ/SOG/Polyimide or other thick dielectrics 140 are next applied and/or bake cured by standard practice to improve VDS blocking voltage, and additional surface protection of the MOCVD 2DEG films 100 (see FIG. 12). Additionally, an application of a dielectric material such as spin-on-glass 140 or the like may help to planarize the wafer surface 45 as desired. The wafer 45 can be surface polished to help further planarize the surface topology as desired (see FIG. 13). During planarization, the top surface of the wafer 45 can be chemically and/or mechanically polished down to about the top surface of the Silicon wafer material as desired to facilitate the contact masking level 11. This next $11^{th}$ masking level is employed to provide contact vias by exposing contact regions to the Gate via metal pads, and Transfer LDMOS Source contact regions (N+/P+). The poly Gate material 155 is typically wet/dry etched to expose the P+ contact 170, N+ Source regions 175 (FIG. 16) and additional Gate via pad regions as desired. The contact regions are dry and/or wet etched to expose by removing top surface dielectric material such as Polyimide/SOG, LTO, or similar exposing the desired contact regions. Next topside metal (1-6 um) is deposited to provide a robust, and reliable metallization for wire bonding, Sintering, Soldering, or similar. The wafer 45 is typically then deposited with Al, Ti, Ni, Au, or other like topside metallization(s) 180 to provide good ohmic contact to the N+ Source, and P+ diffusions 185 (FIG. 18), along with Gate via pads as necessary. The topside metallization 180 is then patterned using the $12^{th}$ masking level, to define the Source and Gate topside metal regions 190 by wet and/or dry etching of exposed metal(s), followed by standard metal anneal. Typical topside metallization thickness is about 4 um to about 6 um. In this example case 6 um of Al/2% (Si/Cu) is used to provide for a wire bondable topside metal layer.

Figure 18:
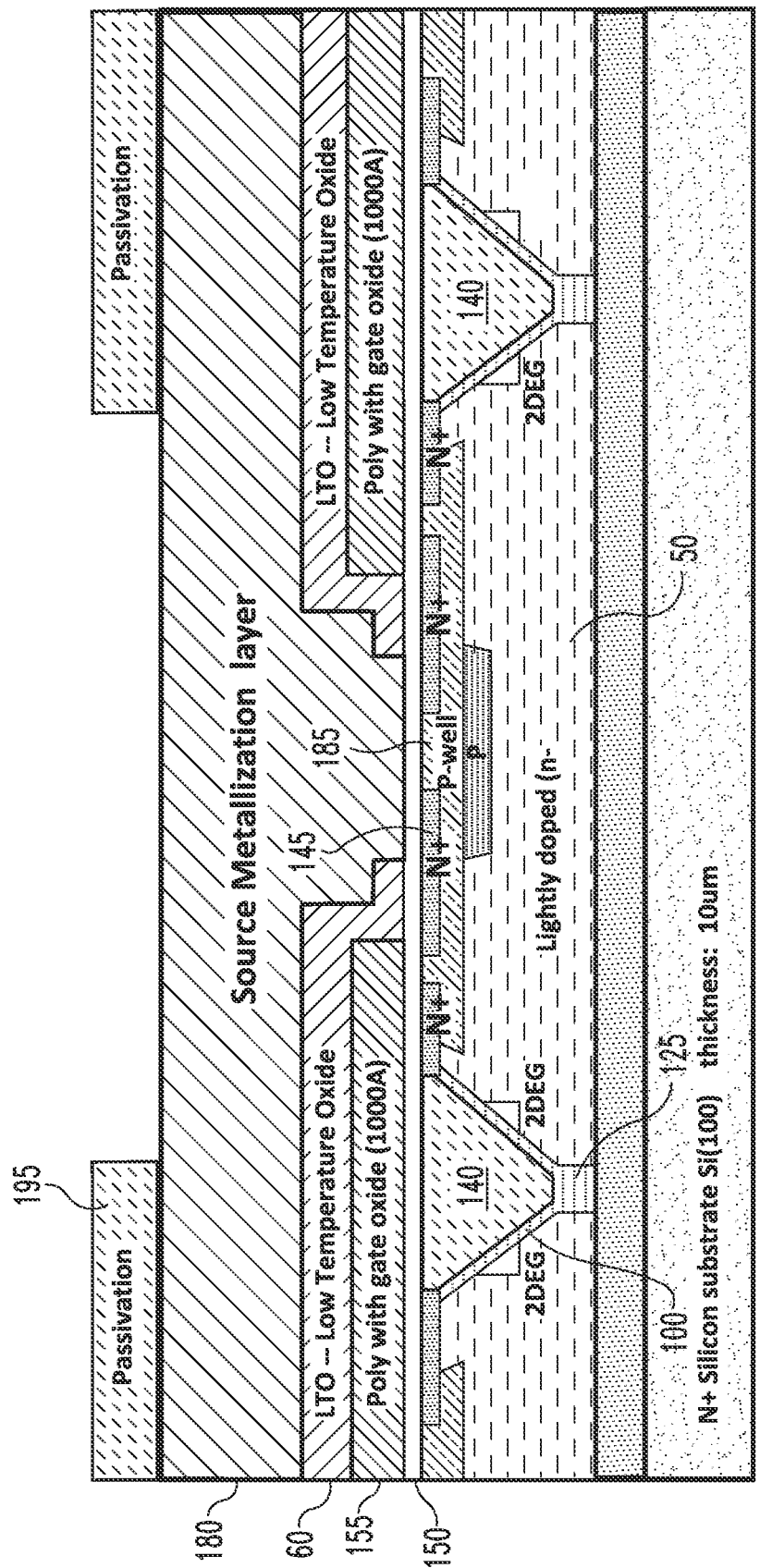
Figure 19:
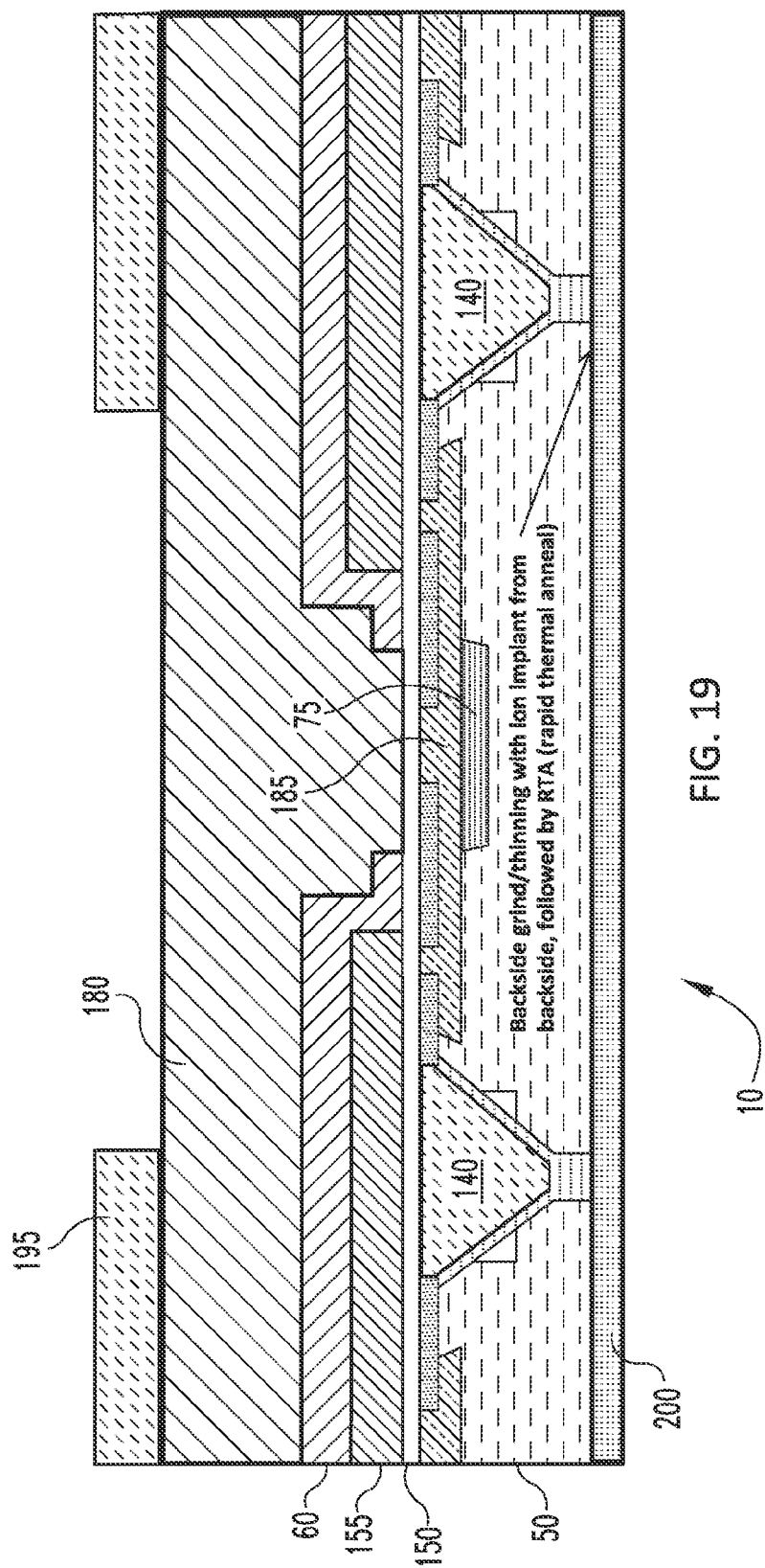
Figure 20:
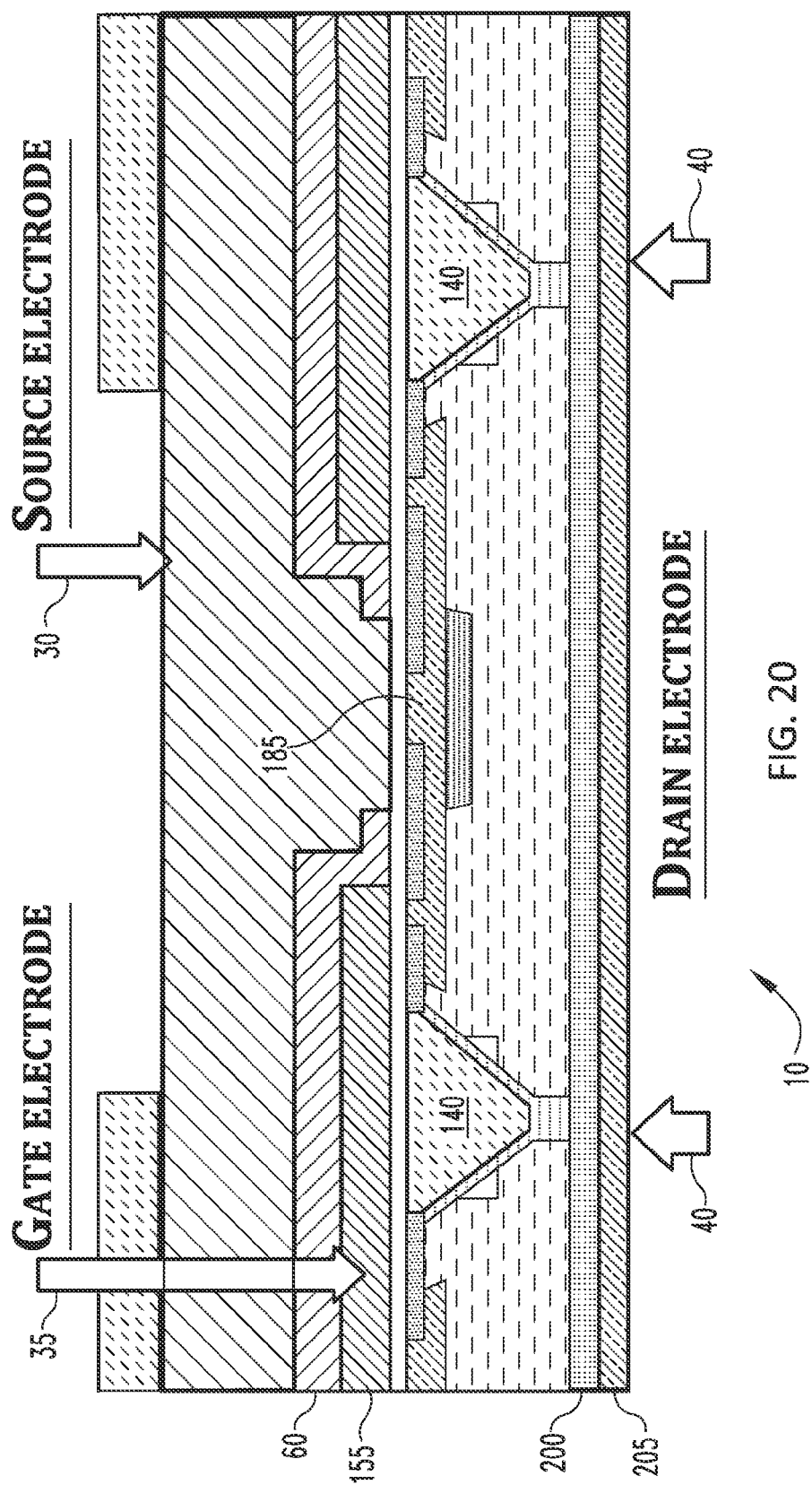
Figure 21:
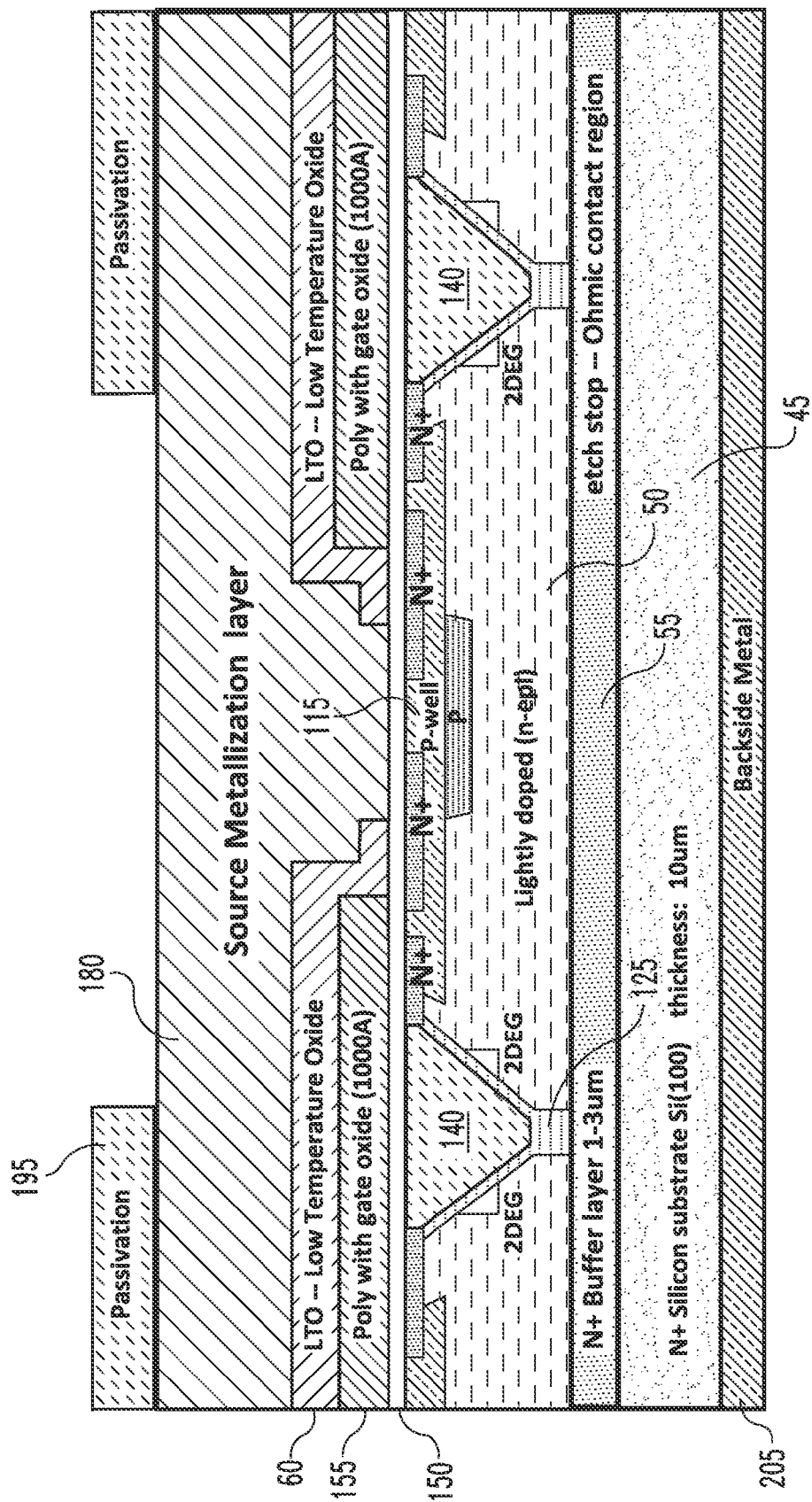
Figure 22B:
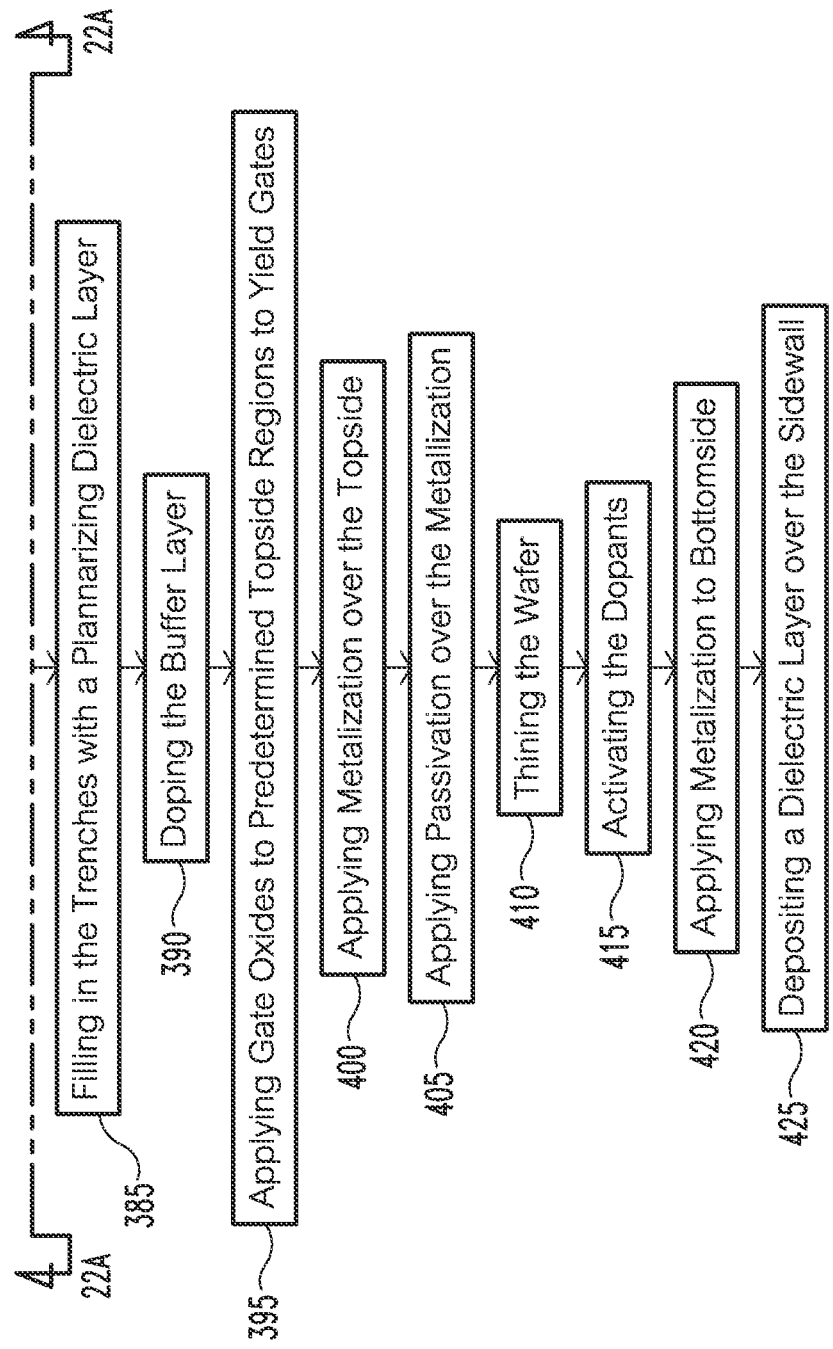
Figure 24:
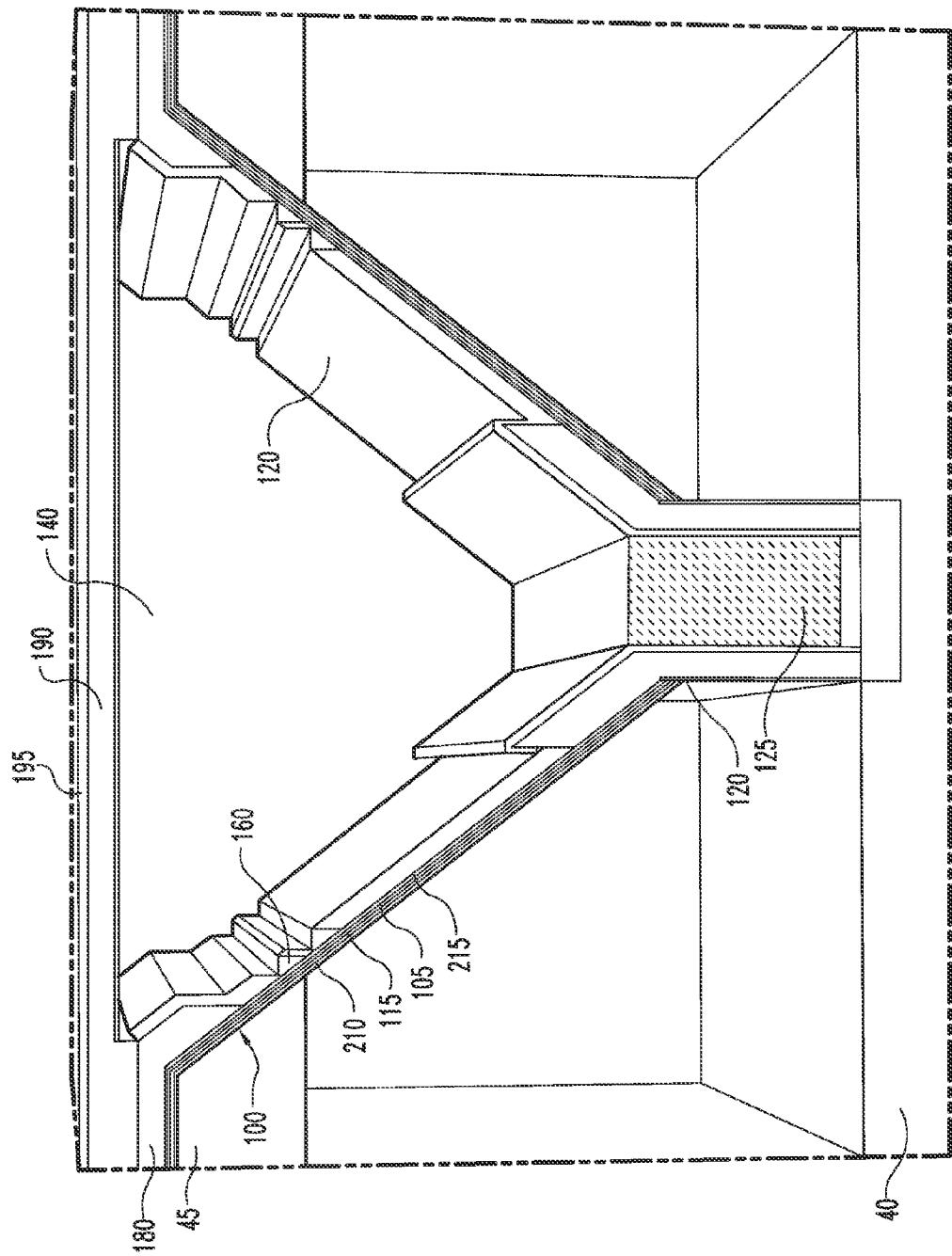
Figure 25:
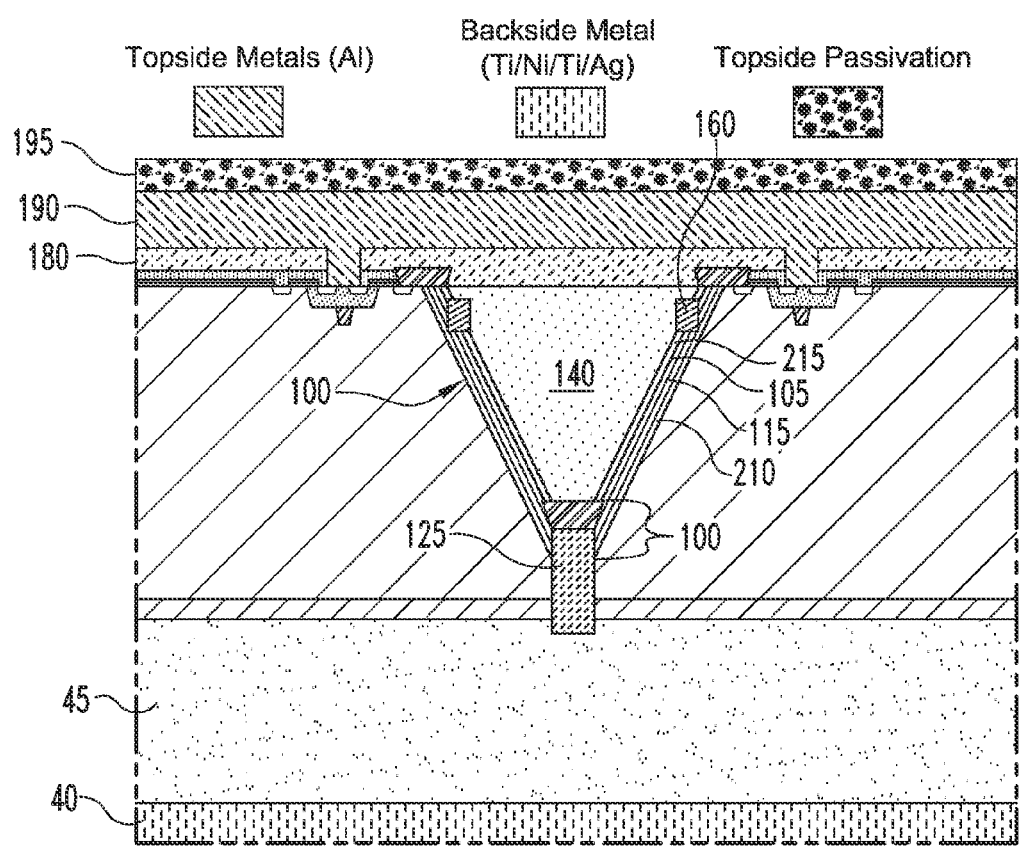

As seen in FIG. 18, the wafer 45 is typically then coated with a top side passivation layer 195 to protect the surface 45 of the device 10 from contamination and/or surface damage. The passivation layer 195 is typically about 4 KA-8 KA in thickness of deposited Silicon Nitride. This is then followed by a $13^{th}$ masking layer used to pattern the topside passivation to expose the Source, and topside Gate metal electrodes/pads. Additionally, to provide topside solder pads/balls, a $14^{th}$ mask can be employed using a thick polyimide, or Kapton film to provide for application of solder paste followed by IR reflow as desired.

If an aggressive thinning of the wafer 45 is desired, such as for thin substrate products typically without epitaxial layer(s), the wafer 45 is typically mounted to a carrier wafer for ease of handling and added surface protection, and more typically is thinned using mechanical and/or chemical polishing and/or etching techniques.

Typically, an N+ ion implantation may be desired to yield for good ohmic contact to Drain/2DEG regions, such as to yield a non-buffer layer device. In this case, a rapid thermal anneal may be performed to activate the implanted dopents. For example, a 2DEG N+ Drain implant 200 may be created without N-epi 50 or N+ buffer regions 55 (see FIG. 19).

On the other hand, a THEMT device 10 with a Silicon substrate 45, an N+ buffer layer 55, and a topside (N—) epitaxial layer 50 would typically require the support of a carrier wafer (not shown).

The wafer 45 may be back side metallized, such as by adding Ti/Ni/Ti/Ag metallization 205. This process is typically followed by a (typically 400° C.) anneal, more typically carried out in $N_2$ forming gas or a like environment. The carrier wafer 45 is then typically disengaged and the wafer 45 is tested, cut and the final product die singulation is carried out.

In operation, the process for producing a THEMT or like device 10 may be summarized as follows. A Silicon or like substrate 45 having a substantially flat topside 61 and a substantially flat, oppositely disposed bottomside 63 is provided 300. The substrate 45 typically includes an epitaxial layer 50 at least partially covering the topside 61, and more typically includes a buffer layer 55 therebetween. A first dielectric layer 60 is formed 305 over the substrate 45 and/or the epitaxial layer 50. A photoresist layer 65 is deposited 310 over the first dielectric layer 60. A predetermined portion of the photoresist material 65 is removed 315 to define a negative photoresist pattern 69. A predetermined portion of the first dielectric layer 60 corresponding to the negative photoresist pattern 69 is removed 320 to define exposed portion(s) 67. Next, dopants are implanted 325 into the exposed portion 67 to define doped portion(s) 70. Silicon or wafer material is preferentially removed 330 from the exposed portion(s) 70 to generate trenches 15 having V-shaped cross-sections and having first and second angled sidewalls defining the V-shaped cross-section, wherein each angled sidewall defining the V-shaped cross-section is a Silicon face having a 111 orientation. The remaining first dielectric layer is removed 335, and a growth promoter may be applied 340 to the at least one sidewall. A stress buffer layer 55 may be applied 345 to the at least one sidewall, and then a 2DEG is formed 350 on the sidewall. Specifically, the 2DEG may be formed by first forming 355 GaN layer on the at least one sidewall, then a Al 27%-Ga73% N layer is formed 360 over the first GaN layer, and then a second GaN layer is formed 365 over the Al 27%-Ga73% N layer to yield a 2DEG layer. A second dielectric layer is deposited 370 over the at least one sidewall, and a first buffer layer is formed 375 to at least partially cover the bottomside 62. A Drain is formed 380 on the bottomside, such as by forming 381 at least one ohmic contact in the first buffer layer to define a Drain. Next, another dielectric layer is deposited 385 to fill in trenches and planarize the substrate 45. The buffer layer is doped 390 to define a highly doped buffer layer, and Gate oxides are applied 395 to predetermined portions of the topside 61 to define Gate regions. A metallization layer is typically applied 400 over predetermined portions of the topside 61 to define Source regions, and a passivation layer is typically applied 405 over the first metallization layer. The wafer 45 is typically thinned 410 and the respective dopants activated 415. A metallization layer is typically applied 420 over the bottomside, and the wafer 45 is typically then annealed 425. The doped layer typically has a dopant concentration of between about $10^{13}$ dopants per cubic centimeter and about $10^{18}$ dopants per cubic centimeter and the highly doped buffer layer typically has a dopant concentration of between about $10^{18}$ dopants per cubic centimeter and about $10^{20}$ dopants per cubic centimeter and is typically between about 1 micron thick and about 3 microns thick. The topside passivation layer is typically between about 0.4 micron thick and about 0.8 micron thick. The first dielectric layer is typically between about 1 Angstrom unit thick and about 10 microns thick and the first dielectric material is typically selected from the group including $SiO_2$, $Si_3N_4$, and combinations thereof.

The present novel technology lends itself to several devices, as detailed below. The following is not a comprehensive list of possible device configurations, but is intended to suggest but a few of the many possible devices that may benefit from the present novel technology.

Solar Cells:

Solar cells may be produced by etching the Si (100) or Si (110) starting surface orientation to create a Si (111) etched surface to yield a V-groove or trench 20 as described above, with a typical depth of about 10-200 um. Typically, the trench 20 is between about 25-50 um deep to yield to a 50-70% increase in surface area of the wafer 45. Compound semiconductor films 43 may then be engineered on the Si (111) etched surface, to create variable band-gap compound semiconductors capable of converting incident photon energy(s) to electron/hole pairs. The compound semiconductor P/N junction 47 may then be contacted using standard Ohmic contact techniques or the like, to yield a solar cell chip capable of efficiently absorbing photons due to the increased surface area arising from the trench components as well as making use of internal reflection/absorption of the V-groove structure for capturing photons.

Light Emitting Diodes (LEDs):

LEDs may be produced by etching the Si (100), or Si (110) surface to expose the Si (111) plane as described above. As is the case with above described Solar Cell embodiment, LEDs would also benefit from a 50-70% increase in available surface area, thus providing for more photon output per unit area. The grooved surface also allows for reflective angles that urge light emission. Compound semiconductor films 43 may then be used to elicit the various light emission frequencies. In addition, the V-groove may be filled with phosphor material to help modulate the quality of the light. In addition, the structure can be made with either a top-side or a bottom-side reflective coating. Ohmic contacts to the P/N junction may be made from either top or bottom surfaces using standard methods.

Sensors:

Sensors may be produced by etching the Si (100), or Si (110) planes to expose the Si (111) plane, followed by the production of a compound semiconductor film 43, such as GaN/AlGaN, to create a piezoelectric induced displacement charge. As the Silicon/compound semiconductor sensor surface experiences mechanical strain, the piezoelectric character of the GaN films 43 is then employed to sense these strains as a change in charge or capacitance related to the sensing structure, to produce, for example, capacitive coupled sensor or typical Wheatstone bridge sensor. As GaN films have desirable piezoelectric properties, these devices offer better mechanical sensitivity/sensor performance (at reduced cost) and still allow for CMOS to be integrated into the same die.

CMOS—Compound Semiconductor Films on Same Chip/Die:

The possibility of starting with the Si (100) plane or surface substrate orientation and then etching in the Si (111) plane for compound semiconductor film 43 growth allows for the integration of CMOS, DMOS, or similar digital transistor technology to be integrated along with the GaN structure on the same die. Bipolar devices may likewise be designed into the same monolithic chip as the compound semiconductor device structures.

Trench Light Emitting Diode Filaments (TLED-Fs):

TLED-Fs may be fabricated by, typically, first etching a Silicon (or like material) wafer Si(100) or Si(110) surface orientation to etch out Self-Limiting Stable Profiles or geometric Si(111) surface planes. The exposed Si(111) surface area will allow for as much as 30-70% more light producing surface area per TLED Die, thus enabling additional photon output per die unit area. TLED fabrication using Silicon substrate material offers the possibility of low cost and high quality large diameter (8-16 in) starting materials. The Silicon etched surface is then further processed to first complete a Trench Light Emitting Diode (TLED) device as described above.

Further, the bottom side of the completed TLED Silicon substrate may then be further thinned. The Silicon wafer may then be (dry or wet) etched (isotropic or anisotropic), and may be etched to completely and/or to substantially remove Silicon wafer material.

In some cases, it may be desirable to partially remove the Silicon substrate material to allow for the formation of additional complex topside semiconductor surface device structures, such as DMOS, CMOS, bipolar, or like chip technology to then be safely fabricated as a monolithic chip along with the compound semiconductor devices as outlined above.

The wafer may then be composed of fully Silicon etched compound semiconductor TLED filament structures, or TLED-F dice with the Silicon completely or substantially etched away, thereby further increasing the photon light emission in a similar manner as a light filament used in a standard incandescent light bulb. Alternate embodiments may, for example incorporate monolithic TLED-F device structures and dimmer/timer CMOS circuitry on the same chip.

One embodiment TLED-F chip may be produced by thinning the typical Silicon trench LED (TLED) wafer technology, as outlined above, to about 75 um to about 100 um, and then removing or substantially reducing the remaining Silicon substrate, such as by wet etch KOH, TMAH, or non-chlorinated dry etch chemistry. This will ensure that the compound semiconductor TLED-F film stack crystalline materials are not inadvertently etched, leaving a compound semiconductor integrated filament-like structure suitable for further standard wafer manufacturing processes.

Trench High Electron Mobility Transistor-Filament (THEMT-F):

FIG. 23 illustrates a transistor device utilizing the trench geometry in greater detail. A substrate 45 having a pair of angled faces or 111-planes 90 defining a trench 20 is shown in cross-section. The faces converge upon an Ohmic contact 125, such as Ti seed or Ni plating. A passivation layer 120, such as Silicon Nitride, partially covers the sides of the contact 125, which a Drain electrode 40 likewise connects thereto.

The trench faces 90 are coated with multiple layers of materials, the first layer adjacent to the substrate 45 being a nucleation layer 210, such as MN, AlN/GaN and typically about 1-3 KA thick. Next, a buffer layer 115 is interposed between the nucleation layer 210 and a GaN 2DEG layer 105. The buffer layer is typically $Al_xGa_yN$, with $0 \le x \le 1$, $0 \le y \le 1$, and $x+y=1$, or the like. The buffer layer is typically about 1-5 µm thick. The GaN 2DEG layer is typically about 100-500 Å thick and has a typical composition of $Al_{0.25}/Ga_{0.75}N$.

A cap layer is interposed between the GaN 2DEG layer and a layer of 2DEG metal. The cap layer is typically about 10-20 Å thick and made of undoped GaN. The 2DEG metal layer is typically layered Ti/Al/Au, and is about 1/2/1 KÅ thick.

A passivation layer is formed over the metal layer. The passivation layer is typically Silicon Nitride and about 1-4 KÅ thick. The trench 15 is filled in with an inter-dielectric, such as polyimide. The device is coated with a topside metallization, such as Al, typically 4-6 µm thick, which is in turn covered by a topside passivation layer, such as Silicon Nitride 4-8 KÅ thick.

Detailed Process Example TLED/F:

Starting Silicon/Photo-Masking/Etching Hard Mask:

Starting with an N-type Si(100) substrate instead of a Si(111) substrate orientation, the Si(100) Silicon wafer is first deposited with $Si_3N_4$ and/or $SiO_2$ (1 A-10 KA). Standard photo-tools can be used to pattern photoresist used to pattern the hard mask oxide layer. After etching the oxide mask, the exposed Si surface is now cleaned and prepared for anisotropic chemical Silicon wet etching.

Anisotropic Silicon Wet Etching Process:

After application of the Silicon etch mask and wet etching processes, the Si(100) starting wafer orientation is then anisotropically etched to define one or more self-limiting geometric surfaces, composed of etched Si(111) planes and/or a combination of partially etched planes to a depth of 50 um. Typical etch rates for Silicon TMAH wet etching are 1 um/min.

Wafer Cleaning After Silicon Etch:

The etched wafer is then exposed to a general buffered oxide etch (BOE/1-15 sec) (or other standard cleaning etches, such as an RCA clean/1-10 sec or the like). In other embodiments, standard wafer cleaning processes may be used to remove any residue $Si_3N_4$ and/or $SiO_2$, or foreign metal/organic contaminate materials.

Compound Semiconductor Film Growth:

The entire cleaned etched wafer surface 45 is then deposited or grown with compound semiconductor crystalline materials and/or additional material layers 43 to form the final compound semiconductor TLED film structure 49. This is generally achieved by a high temperature $H_2$ wafer pre-clean, followed by metal organic chemical vapor deposition (MOCVD), hydride vapor phase epitaxial (HYPE), or like processes/tools/methods. It should be appreciated that many different processes/tools/methods may be used, by which a compound semiconductor material and/or other film 43 can be grown or deposited on an etched Silicon substrate 45 or like substrate material. These would include, but are not limited to, a stress relief buffer layer composed of $Al_2O_3$, and/or MN, GaN, N or P type GaN, AlGaN, TiO, GaAs, ZnO, or like compounds, or single-phased Ge, Si, Ga, or like semiconductors, and/or $SiO_2$, $Si_3N_4$, or like layers to reduce defect density, and/or multiple quantum wells (MQWs), such as of In(x %)Ga(1−x %)N—GaN, for additional photon emission/frequency control, and the like.

Transparent/Reflective Ohmic Contacting Layer(s):

After film growth/deposition (in this example, to a depth of about 3-4 um), one or more transparent metal layer(s) 51 (such as Au, Ni, Indium Tin Oxide (ITO), or like suitable films) are deposited to provide for a transparent Ohmic contact material layer 51 to the compound semiconductor N and/or P type material layer(s) 43. This layer 51 may be thickened and used as a reflective/refractive layer 53 for flip chip applications, for example, to increase photon output of the TLEDF completed structures by providing a bottom side reflective surface 53. Typically, the Ohmic contact later 51 is deposited by CVD or the like MOCVD/HVPE Film Stack Protective Layer:

The transparent/reflective metal layer(s) 51 may then be coated with a thin protective layer (10 A-10,000 A) 57 of Silicon Nitride or other suitable. The Silicon Nitride layer 57 may also provide a subsequent Ohmic contact masking layer 59 as desired.

Overcoat Planarization:

The wafer is then planarized such as by use of polyimide, spin-on-glass/dielectric material, or the like. The topside Silicon wafer etched volume is then typically filled and utilized with a phosphor doped thermo-set material to provide light softening and/or color. For example, a single or multi-layer coating of a polyimide spin-on film may be deposited, followed by coating of spin-on-glass/dielectric material, typically doped with phosphor, to fill in the 50 um etched wafer topside surfaces to provide for a stable working surface for subsequent wafer polishing/planarization. Typically, these films require a soft bake (150° C./2-3 min) followed by a hard bake below 350° C. for (30-60 min). Film thickness, per pass, of about 1 um to about 20 um are easily achievable.

Chemical Mechanical Surface Polishing:

The wafer 45 may then be chemically and/or mechanically polished for flatness and additionally polished as desired to yield a smooth wafer surface.

Contact Etching of Topside N/P Materials:

After the wafer 45 is planarized, a polyimide dielectric top layer 60 or the like is typically patterned thereupon to allow for etching down to the appropriate P and/or N type compound semiconductor layer(s). These layers may be further etched with a separate standard masking layer 65 to expose the appropriate P and/or N-type compound semiconductor material layer(s) for additional Ohmic contact(s) 125 as desired.

Topside Metallization and Etch:

Metallization layer(s) is/are then deposited and metal interconnect mask patterning/etching of metal layer(s) is done. In some cases the order of etching and metal layer deposition may be mixed for efficiency and/or to reduce processing steps, as desired.

Topside Passivation and Etch:

After the final metal layer is patterned for die surface interconnect, a single or, more typically, dual pass (for pinhole protection) final passivation layer is deposited onto the wafer 45, such as of 2-8 KA of Silicon Nitride deposited and etched to expose the bonding pads or final solderable metallization surface pads. The Silicon Nitride film, or like suitable passivation film, may also be left un-etched to allow for full and complete topside surface protection during subsequent Silicon wet/dry etching process step(s), and may then be pad etched later in the process flow.

Solder Bumping of Wafer:

For a green package using lead-free solder flip-chip, or sintered direct surface mount package format, an additional lead free solder mask may be used to process a final solder/ sinter surface and/or ball(s). This final sinter/solderable ball/ layer/pattern may then be used for direct surface mount applications as desired without need for additional solder materials.

Silicon Wafer Thinning and Filament Etch:

The Silicon Nitride surface coat, and/or by use of wafer surface metals/films that resist degradation during standard Silicon wet etching the wafer 45 is prepared for partial or complete Silicon etching, which typically includes a mechanical grinding operation to thin the wafer 45 to reduce the final Silicon etching time and cost.

The wafer 45 is then exposed to a wet etch bath of KOH, TMAH, or other standard bulk Silicon wet/dry etching assent to selectively etch the wafer 45, leaving behind the compound semiconductor filament structure, continuous topside film(s), and/or Silicon device structure(s) if a partial etch is used.

Final Wafer Surface Coat:

The compound semiconductor filament structure wafer is then surface coated using standard wafer processing equipment and materials such as SOG/D, polyimide, phosphor doped thermo-set liquid material that is spin coated and bake hardened, or any other suitable topside coating for color control, reflectivity, refractive index, or the like.

Final Test and Deliver Methods:

The finished compound semiconductor wafer is typically then cleaned. A wafer test is usually then performed for quality control, and then the wafer is then cut into individual portions, such as to be used as a fully tested final assembly chip scale packaged device.

In this final chip scale package format, the sawn good die can then be placed into pocket tape, waffle pack, or mounted/ used directly from sawn expanded nitro frame. In this way, the device may be mounted directly onto the final customer substrate suitable for TLEDF solid state lighting applications or the like, without the need for further device packaging or electrical testing costs.

Final Device Mounting Methods:

The TLEDF die having separate solderable anode and cathode pads, for example, allows for the device to be lead-free solder IR reflowed, sintered, conductively glued, or other similar method/materials onto the downstream/customer's circuit board application. A wire bondable 2-5 mil wire bonding pad version allows for chip-n-wire applications.

Applications:

TLEDF device applications may include: commercial/residential light bulbs, automotive displays, head/tail lamps, traffic lights, outdoor lighting, backlight/head up displays, flat panel displays, flashlights, and numerous other commercial, aerospace, military, and general purpose LED applications.

Solar Cells:

The above TLEDF chip may give rise to a MOCVD or HVPE compound semiconductor photo voltaic solar cell device structure. For example, a solar cell device may be transparently encapsulated by SOD/SOG and/or polyimide films, allowing for sunlight to penetrate the packaged device from all directions increasing the device's performance and ease of use. The thinness of the device and the inherently flexible film structures may allow for wearable/moldable large area solar cells.

By using low cost Silicon based starting material, manufacturing and efficient thin film variable bandgap compound semiconductor MOCVD/HVPE solar cell film engineering a low cost technology platform for new and existing solar cell applications is achieved.

Sensors:

The above chip 10 may likewise give rise to a more substantially etched Silicon wafer with P-type Boron layer(s) acting as etch stops, along with fabricated solid self-limiting features that may not be fully etched (p-type etch stopped if desired, such as an inverted trapezoid) in which the bottom face is partially etched to the Si (100) or Si (110) plane. This structure, would then be film deposited/grown with a piezoelectric AlGaN/GaN for example, or other suitable sensing selected for its inherent sensitivities to changes in the mechanical stresses or other properties induced in the film. For example, a wheat-stone capacitive and/or resistive bridge network sensor structure could be fabricated in which Silicon etched surfaces are MOCVD deposited with piezo-electric charge sensitive films. This structure would yield comprise a balanced resistive Wheatstone bridge, capacitively coupled bridge, or numerous other sensor device structures sensitive to changes in charge, resistance, capacitance, magnetic flux fields, electric fields, photon fluctuations, and numerous like film sensing characteristics. Etching away the bottom portion of the Silicon substrate allows for a partially or fully etched exposure of the compound piezo-electric crystalline film, allowing for a sensing structure that can then be used in various sensing applications including, biomedical and space applications, which may benefit from the increased sensitivity of various compound semiconductor film structures.

Vertical THEMT Power Devices:

THEMT power devices may benefit from a backside thinning process, can then be Silicon wet/dry etched, to substantially reduce the remaining Silicon and expose only the compound semiconductor for further isolation and Drain metal connection. From this backside Silicon etched surface, standard wafer manufacturing processes may be used to apply polyimide and/or spin-on-glass dielectric, or other suitable dielectric material. These dielectric materials help isolate the Drain compound semiconductor connection, from the Silicon/compound semiconductor Source connection scheme. This standard process method allows for very high blocking voltage ($V_{DS}$>1 KV).

After the dielectric layer is formed, the backside surface is prepared for Drain connection backside metal and annealing process steps to the exposed and isolated compound semiconductor Drain material.

Similar to the TLEDF, this process method would allow for wafer test/die separation, and mounting into a standard solderable/sintered package style (dual sided cooling), or chip 'n' Al wire package styles (DPAK/PSO8/D2PAK) such as based on green lead free tin/silver solder packaging technologies.

While the invention has been illustrated and described in detail in the drawings and foregoing description, the same is to be considered as illustrative and not restrictive in character. It is understood that the embodiments have been shown and described in the foregoing specification in satisfaction of the best mode and enablement requirements. It is understood that one of ordinary skill in the art could readily make a nigh-infinite number of insubstantial changes and modifications to the above-described embodiments and that it would be impractical to attempt to describe all such embodiment variations in the present specification. Accordingly, it is understood that all changes and modifications that come within the spirit of the invention are desired to be protected.

I claim:

1. A transistor device, comprising:
a crystalline silicon substrate member;
a first substantially flat surface formed on the substrate member;
a second oppositely disposed surface formed on the substrate member and spaced from the first surface;
a third surface formed on the substrate member and extending from the first surface and following a 111 orientation plane;
a source structure formed in the first surface;
a gate structure formed in the first surface and spaced from the source structure;
a drain structure formed on the second surface;
a dielectric layer formed on the first surface;
a p-well formed in the first surface and positioned between the gate structure and the source structure;
wherein the dielectric layer is between about 10 microns thick and about 200 microns thick; and
wherein the third surface hosts a 2-dimensional electron gas.

2. The device of claim 1 wherein the second surface is substantially parallel to the first surface.

3. The device of claim 1 wherein a second dielectric layer is formed over the second surface.

4. The device of claim 1 and further comprising a fourth surface formed on the substrate member and extending from the first surface and following a 111 orientation plane; wherein the fourth surface intersects the third surface; and wherein the intersection of the third and fourth surfaces defines a first volume having a V-shaped cross-sectional shape.

5. The device of claim 4 and further comprising a dielectric wedge filling the first volume.

6. The device of claim 1 and further comprising a metallization layer positioned between the dielectric layer and the first surface.

7. The device of claim 6 and further comprising a first low-temperature oxide layer positioned between the source structure and the metallization layer and a second low-temperature oxide layer positioned between the gate structure and the metallization layer.

8. The device of claim 1 and further comprising a first N-type buffer layer positioned on the first surface between the p-well and the third surface.

9. The device of claim 1 and further comprising a second N-type buffer layer positioned on the second surface.

10. A transistor device, comprising:
a semiconducting substrate having a generally flat top surface and a generally parallel spaced bottom surface, wherein each surface has a [110] or [100] orientation;
a first device surface extending from the top surface towards the bottom surface and having a [111] orientation;
a two-dimensional electron gas formed on the device surface;
a drain contact operationally connected to the two-dimensional electron gas and formed on the bottom surface;
a source contact formed on the top surface and operationally connected to the two-dimensional electron gas;
a gate contact formed on the top surface and operationally connected to the two-dimensional electron gas; and
a gate formed on the first device surface and operationally connected to the two-dimensional electron gas.

11. The transistor device of claim 10 wherein the semiconducting substrate is silicon.

12. The transistor device of claim 11 and further comprising:
a nucleation layer formed on the device surface;
a buffer layer formed on the nucleation layer;
an generally GaN layer formed on the buffer layer and defining a two-dimensional electron gas;
a cap layer formed on the generally GaN layer; and
a metal layer formed over the cap layer.

13. The transistor device of claim 12 wherein the nucleation layer is an AlN/GaM composition; wherein the nucleation layer is between about 1KÅ and about 3KÅ thick; wherein the buffer layer is $Al_xGa_yN$, with $0\leq x\leq 1$, $0\leq y\leq 1$, and $x+y=1$; wherein the buffer layer is between about 1 µm and about 5 µm thick; wherein the generally GaN layer is $Al_{0.25}Ga_{0.75}N$ layer; wherein the generally GaN layer is between about 100 Å and about 500 Å thick; wherein the cap layer is undoped GaN; wherein the cap layer is between about 10 Å and about 20 Å thick; wherein the metal layer is layered Ti/Al/Au; wherein the Ti layer is about 1 KÅ thick; wherein the AL layer is about 2 KÅ thick; and wherein the Au layer is about 1 KÅ thick.

14. The device of claim 10 and further comprising a second device surface spaced from and positioned opposite the first device surface; wherein the second device surface extends from the top surface towards the bottom surface; wherein the second device surface has a [111] orientation; and wherein the first and second device surfaces define a first trough formed in the substrate having a generally V-shaped cross-section.

15. The device of claim 14 and further comprising a plurality of troughs having generally V-shaped cross-sections formed in the substrate.

16. The device of claim 15 wherein the plurality of troughs are oriented generally parallel to one another.

17. A solid state device comprising:
a semiconducting substrate having a generally flat top surface and a generally parallel spaced bottom surface;
a first device surface extending from the top surface towards the bottom surface;
a second device surface spaced from and positioned opposite first device surface and extending from the top surface towards the bottom surface;
a respective two-dimensional electron gas formed on the respective device surfaces;
a drain contact operationally connected to each respective two-dimensional electron gas and positioned on the bottom surface;
a source contact positioned on the top surface and operationally connected to each respective two-dimensional electron gas;
a gate contact positioned on the top surface and operationally connected to each respective two-dimensional electron gas;
a first gate formed on the first device surface and operationally connected to each respective two-dimensional electron gas;
a second gate formed on the second device surface and operationally connected to each respective two-dimensional electron gas;
wherein the first and second device surfaces define a trench having a V-shaped cross-section.

18. The solid state device of claim 17 wherein the substrate is silicon and wherein each respective device surface has a [111] orientation.

19. The solid state device of claim 17 wherein each respective two dimensional electron gas is confined to a respective $Al_xGa_yN$ layer formed on each respective device surface; wherein each respective $Al_xGa_yN$ layer is between about 100 and about 500 Angstrom units thick.

20. The solid state device of claim 19 wherein x=0.25 and y=0.75.

* * * * *